US012641980B2

(12) United States Patent (10) Patent No.: US 12,641,980 B2
Yang et al. (45) Date of Patent: May 26, 2026

(54) DISPLAY DEVICE INCLUDING A COLOR FILTER DISPOSED ON A BANK STRUCTURE

(71) Applicant: SAMSUNG DISPLAY CO., LTD., Yongin-si (KR)

(72) Inventors: Dong Hyun Yang, Yongin-si (KR); Eui Suk Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 290 days.

(21) Appl. No.: 18/344,574

(22) Filed: Jun. 29, 2023

(65) Prior Publication Data

US 2024/0138224 A1 Apr. 25, 2024
US 2024/0237465 A9 Jul. 11, 2024

(30) Foreign Application Priority Data

Oct. 19, 2022 (KR) ........................ 10-2022-0134957

(51) Int. Cl.
*H10K 59/38* (2023.01)
*H10K 59/12* (2023.01)
*H10K 59/122* (2023.01)
*H10K 59/80* (2023.01)

(52) U.S. Cl.
CPC ......... *H10K 59/38* (2023.02); *H10K 59/1201* (2023.02); *H10K 59/122* (2023.02); *H10K 59/8792* (2023.02)

(58) Field of Classification Search
None
See application file for complete search history.

(56) References Cited

U.S. PATENT DOCUMENTS

| | | | |
|---|---|---|---|
| 7,952,101 B2 | 5/2011 | Yamazaki et al. | |
| 9,611,016 B2 | 4/2017 | Salters et al. | |
| 10,784,461 B2 | 9/2020 | Wang et al. | |
| 11,348,983 B1 * | 5/2022 | Choung | .......... H10K 59/80522 |
| 2023/0301139 A1 * | 9/2023 | Choung | .............. H10K 59/122 257/40 |
| 2024/0090300 A1 * | 3/2024 | Hanari | ................. H10K 59/871 |

FOREIGN PATENT DOCUMENTS

| | | |
|---|---|---|
| KR | 2019-0075197 | 7/2019 |
| KR | 2020-0072746 | 6/2020 |

* cited by examiner

*Primary Examiner* — Nduka E Ojeh
(74) *Attorney, Agent, or Firm* — F. CHAU & ASSOCIATES, LLC

(57) ABSTRACT

A display device includes a first and second pixel electrode. An inorganic insulating layer is partially disposed on the first and second pixel electrode. A bank structure is disposed on the inorganic insulating layer and includes a first opening overlapping the first pixel electrode and a second opening overlapping the second pixel electrode. First and second light emitting layers are disposed on the first and second pixel electrodes. First and second common electrodes are disposed on the first and second light emitting layers. A light blocking layer is disposed on the bank structure and includes a first opening hole overlapping the first opening and a second opening hole overlapping the second opening. First and second color filters are disposed in the first and second openings.

20 Claims, 22 Drawing Sheets

Figure 6:
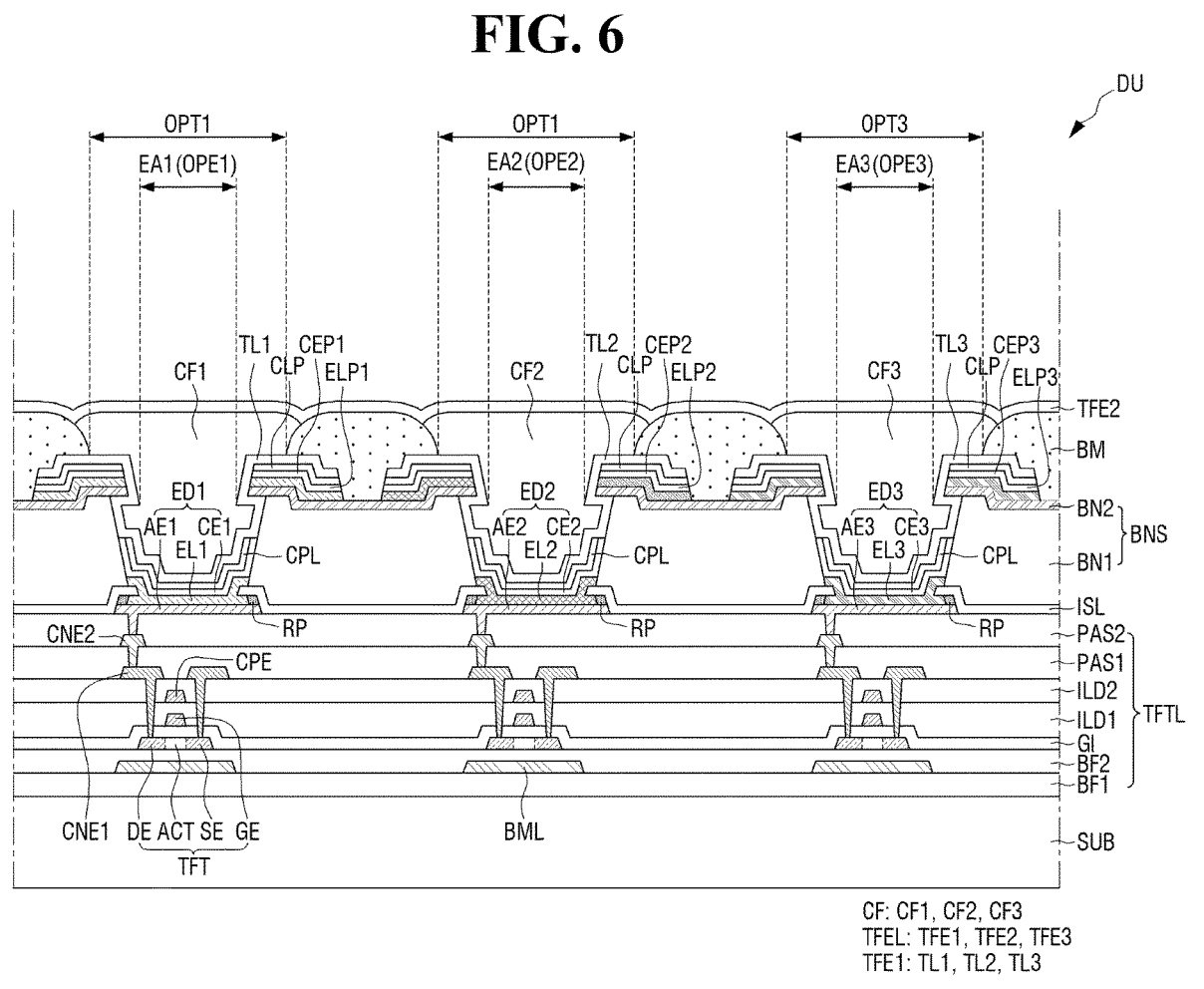

OPT1
EA1(OPE1)

OPT1
EA2(OPE2)

OPT3
EA3(OPE3)

TL1  CEP1
CLP  ELP1
CF1

TL2  CEP2
CLP  ELP2
CF2

TL3  CEP3
CLP  ELP3
CF3

TFE2
BM

ED1
AE1  CE1
EL1       CPL

ED2
AE2  CE2
EL2       CPL

ED3
AE3  CE3
EL3       CPL

BN2
BN1     } BNS

ISL

CNE2        RP
CPE

RP

RP

PAS2
PAS1
ILD2
ILD1      } TFTL
GI
BF2
BF1

CNE1  DE ACT SE  GE              BML
       TFT

SUB

CF: CF1, CF2, CF3
TFEL: TFE1, TFE2, TFE3
TFE1: TL1, TL2, TL3

FIG. 7

TFE1: TL1, TL2, TL3

TFE1: TL1, TL2, TL3

CF: CF1, CF2, CF3
TFEL: TFE1, TFE2, TFE3
TFE1: TL1, TL2, TL3

CF: CF1, CF2, CF3
TFEL: TFE1, TFE2, TFE3
TFE1: TL1, TL2, TL3

CF: CF1, CF2, CF3
TFEL: TFE1, TFE2, TFE3
TFE1: TL1, TL2, TL3

DISPLAY DEVICE INCLUDING A COLOR FILTER DISPOSED ON A BANK STRUCTURE

CROSS-REFERENCE TO RELATED APPLICATION

This application claims priority under 35 U.S.C. § 119 to Korean Patent Application No. 10-2022-0134957, filed on Oct. 19, 2022 in the Korean Intellectual Property Office, the contents of which are herein incorporated by reference in their entirety.

TECHNICAL FIELD

The disclosure relates to a display device and, more particularly, to a display device including a color filter disposed on a bank structure.

DISCUSSION OF THE RELATED ART

As the information society develops, the demand for display devices for displaying images has increased and diversified. For example, display devices have been applied to various electronic devices such as smartphones, digital cameras, laptop computers, vehicle navigation devices, and smart televisions. The display devices may be flat panel display devices such as liquid crystal display devices, field emission display devices, or organic light emitting display devices. Among such flat panel display devices, a light emitting display device may display an image without the need of a backlight unit providing light to a display panel, as each pixel of the light emitting display device panel includes light emitting elements that may emit light by themselves.

SUMMARY

A display device includes a first pixel electrode and a second pixel electrode spaced apart from each other on a substrate. An inorganic insulating layer is disposed on the substrate and is partially disposed on the first pixel electrode and the second pixel electrode. A bank structure is disposed on the inorganic insulating layer and includes a first opening at least partially overlapping the first pixel electrode and a second opening at least partially overlapping the second pixel electrode. A first light emitting layer is disposed on the first pixel electrode and a second light emitting layer is disposed on the second pixel electrode. A first common electrode is disposed on the first light emitting layer and a second common electrode is disposed on the second light emitting layer. A light blocking layer is disposed on the bank structure and includes a first opening hole at least partially overlapping the first opening and a second opening hole at least partially overlapping the second opening. A first color filter is disposed in the first opening and the first opening hole. A second color filter is disposed in the second opening and the second opening hole. The bank structure includes a first bank layer and a second bank layer disposed on the first bank layer and including a metal material that is different from a material of the first bank layer. The second bank layer includes tips that protrude farther from sidewalls of the first opening and the second opening than does the first bank layer.

The first bank layer may include aluminum (Al), and the second bank layer may include titanium (Ti).

The first common electrode and the second common electrode may be in direct contact with side surfaces of the first bank layer, respectively.

The display device may further include a first organic pattern disposed on the second bank layer and at least partially surrounding the first opening and including the same material as the first light emitting layer. A first electrode pattern is disposed on the first organic pattern and includes the same material as the first common electrode. A second organic pattern is disposed on the second bank layer and at least partially surrounds the second opening and includes the same material as the second light emitting layer. A second electrode pattern is disposed on the second organic pattern and includes a same material as the second common electrode.

The light blocking layer may be disposed between the first organic pattern and the second organic pattern, and at least portions of the light blocking layer may at least partially overlap the first organic pattern, the second organic pattern, the first electrode pattern, and the second electrode pattern.

The display device may further include a first inorganic layer disposed on the sidewall of the first opening and disposed on the first common electrode and the first electrode pattern, and a second inorganic layer disposed on the sidewall of the second opening and disposed on the second common electrode and the second electrode pattern. The first inorganic layer and the second inorganic layer may be spaced apart from each other. At least portions of the light blocking layer may be disposed directly on the first inorganic layer and the second inorganic layer.

A portion of the first color filter may at least partially overlap the first organic pattern and the first electrode pattern. A portion of the second color filter may at least partially overlap the second organic pattern and the second electrode pattern.

The first color filter and the second color filter may partially overlap each other on the light blocking layer.

A portion of the first color filter may be disposed on the second color filter on the light blocking layer.

A portion of the second color filter may be disposed on the first color filter on the light blocking layer.

The inorganic insulating layer might not be in contact with each of upper surfaces of the first pixel electrode and the second pixel electrode, a portion of the first light emitting layer may be disposed between the first pixel electrode and the inorganic insulating layer, and a portion of the second light emitting layer may be disposed between the second pixel electrode and the inorganic insulating layer.

The display device may further include residual patterns disposed between the first and second pixel electrodes and the inorganic insulating layer.

The display device may further include a third pixel electrode spaced apart from the second pixel electrode on the substrate. A third light emitting layer may be disposed on the third pixel electrode. A third common electrode may be disposed on the third light emitting layer. The bank structure may further include a third opening at least partially overlapping the third pixel electrode. The light blocking layer may further include a third opening hole at least partially overlapping the third opening. The display device may further include a third color filter disposed in the third opening and the third opening hole.

The display device may further include a third organic pattern disposed on the second bank layer and at least partially surrounding the third opening and including a same material as the third light emitting layer. A third electrode pattern may be disposed on the third organic pattern and may include a same material as the third common electrode. A third inorganic layer may be disposed on a sidewall of the third opening and may be disposed on the third common electrode and the third electrode pattern.

The display device may further include an encapsulation layer disposed on the light blocking layer and the first and second color filters.

A display device includes a bank structure including a plurality of openings which are arranged in a first direction, a second direction crossing the first direction, and a third direction crossing the first direction and the second direction and in which light emitting elements emitting light are disposed. A light blocking layer includes a plurality of opening holes at least partially overlapping the plurality of openings and is disposed between the openings adjacent to each other. A plurality of color filters are disposed in the openings of the bank structure and the opening holes of the light blocking layer and at least partially overlap the light emitting elements. The bank structure includes a first bank layer and a second bank layer disposed on the first bank layer, including a metal material that is different from a material of the first bank layer. and the second bank structure includes tips that protruding farther from sidewalls of the openings than does the first bank layer. The openings include a first opening, a second opening spaced apart from the first opening in the third direction, and a third opening spaced apart from the second opening in the third direction. The color filters include a first color filter disposed in the first opening, a second color filter disposed in the second opening, and a third color filter disposed in the third opening. The first color filter, the second color filter, and the third color filter at least partially overlap other color filters adjacent thereto on the light blocking layer.

The display device may further include a plurality of organic patterns disposed on the bank structure and at least partially surrounding the openings. A plurality of electrode patterns may be disposed on the organic patterns. A plurality of inorganic layers may be disposed on the electrode patterns. The light blocking layer may be disposed between the organic patterns, the electrode patterns, and the inorganic layers different from each other.

At least portions of the light blocking layer may be disposed directly on the inorganic layers, and at least portions of the first color filter, the second color filter, and the third color filter may be disposed directly on the inorganic layers.

A portion of the first color filter may at least partially cover the second color filter on the light blocking layer.

A portion of the second color filter may at least partially cover the first color filter on the light blocking layer.

BRIEF DESCRIPTION OF THE DRAWINGS

The above and other aspects and features of the disclosure will become more apparent by describing in detail embodiments thereof with reference to the attached drawings, in which:

FIG. 6 is a cross-sectional view illustrating a portion of the display device according to an embodiment;

FIG. 7 is an enlarged view illustrating a first emission area of FIG. 6;

DETAILED DESCRIPTION OF THE EMBODIMENTS

The invention will now be described more fully hereinafter with reference to the accompanying drawings, in which embodiments of the invention are shown. This invention may, however, be embodied in different forms and should not necessarily be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers may indicate the same components throughout the specification and the drawings.

It will be understood that, although the terms "first," "second," etc. may be used herein to describe various elements, these elements should not necessarily be limited by these terms. These terms are used to distinguish one element from another element. For instance, a first element discussed below could be termed a second element without departing from the teachings of the invention. Similarly, the second element could also be termed the first element.

Hereinafter, embodiments will be described with reference to the accompanying drawings.

Figure 1:
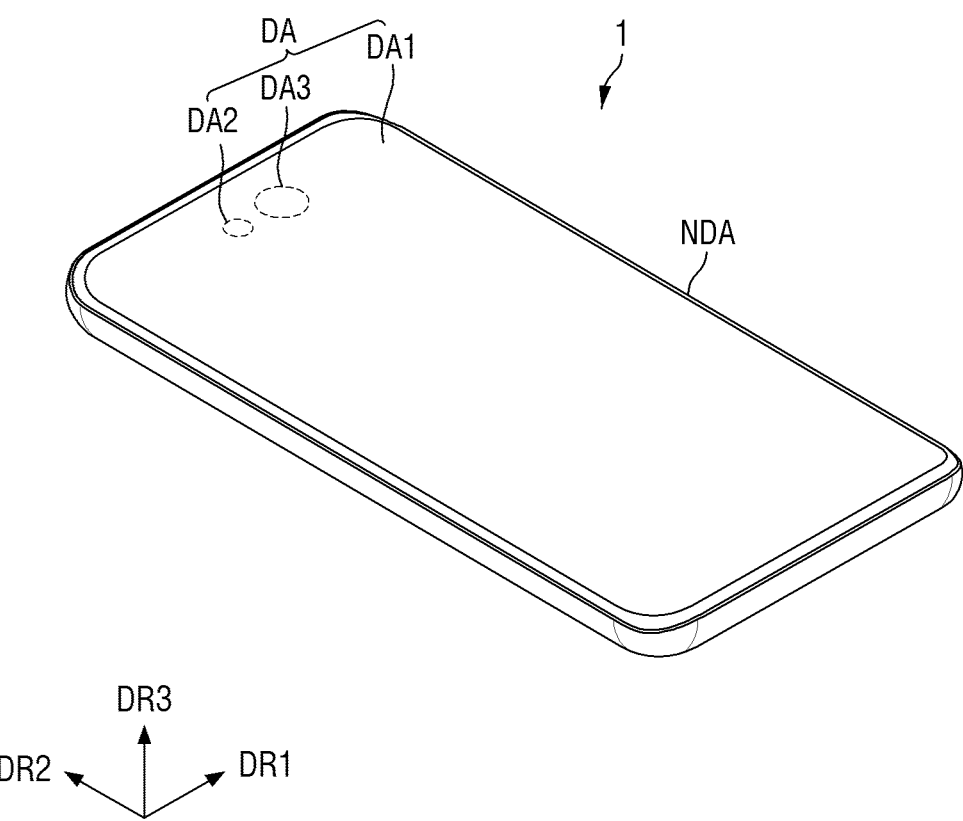
FIG. 1 is a perspective view of an electronic device according to an embodiment.

FIG. 1 is a perspective view of a display device according to an embodiment.

Referring to FIG. 1, an electronic device 1 displays a moving image or a still image. The electronic device 1 may refer to all electronic devices that provide display screens. For example, televisions, laptop computers, computer monitors, electronic billboards, the Internet of Things (IoT) devices, mobile phones, smartphones, tablet personal computers (PCs), electronic watches, smart watches, watch phones, head mounted displays, mobile communication terminals, electronic notebooks, electronic books, portable multimedia players (PMPs), vehicle navigation devices, game machines, digital cameras, camcorders, and the like, which provide display screens, may be included in the electronic device 1.

The electronic device 1 may include a display device 10 (see FIG. 2) providing a display screen. Examples of the display device may include an inorganic light emitting diode display device, an organic light emitting display device, a quantum dot light emitting display device, a plasma display device, a field emission display device, and the like. Hereinafter, a case where an inorganic light emitting diode display device is applied as an example of the display device will be described by way of example, but the disclosure is not necessarily limited thereto, and the same technical spirit may be applied to other display devices if applicable.

A shape of the electronic device 1 may be variously modified. For example, the electronic device 1 may have a shape such as a rectangular shape with a width that is greater than a length, a rectangular shape with a length that is greater than a width, a square shape, a rectangular shape with rounded corners (vertices), other polygonal shapes, or a circular shape. A shape of a display area DA of the electronic device 1 may also be similar to an overall shape of the electronic device 1. In FIG. 1, the electronic device 1 having a rectangular shape with a great length in a second direction DR2 is illustrated.

The electronic device 1 may include a display area DA and a non-display area NDA. The display area DA is an area in which a screen may display an image, and the non-display area NDA is an area in which an image is not displayed. The display area DA may also be referred to as an active area, and the non-display area NDA may also be referred to as a non-active area. The display area DA may occupy substantially the center of the electronic device 1.

The display area DA may include a first display area DA1, a second display area DA2, and a third display area DA3. The second display area DA2 and the third display area DA3 may be areas in which components for adding various functions to the electronic device 1 are disposed, and may correspond to component areas.

Figure 2:
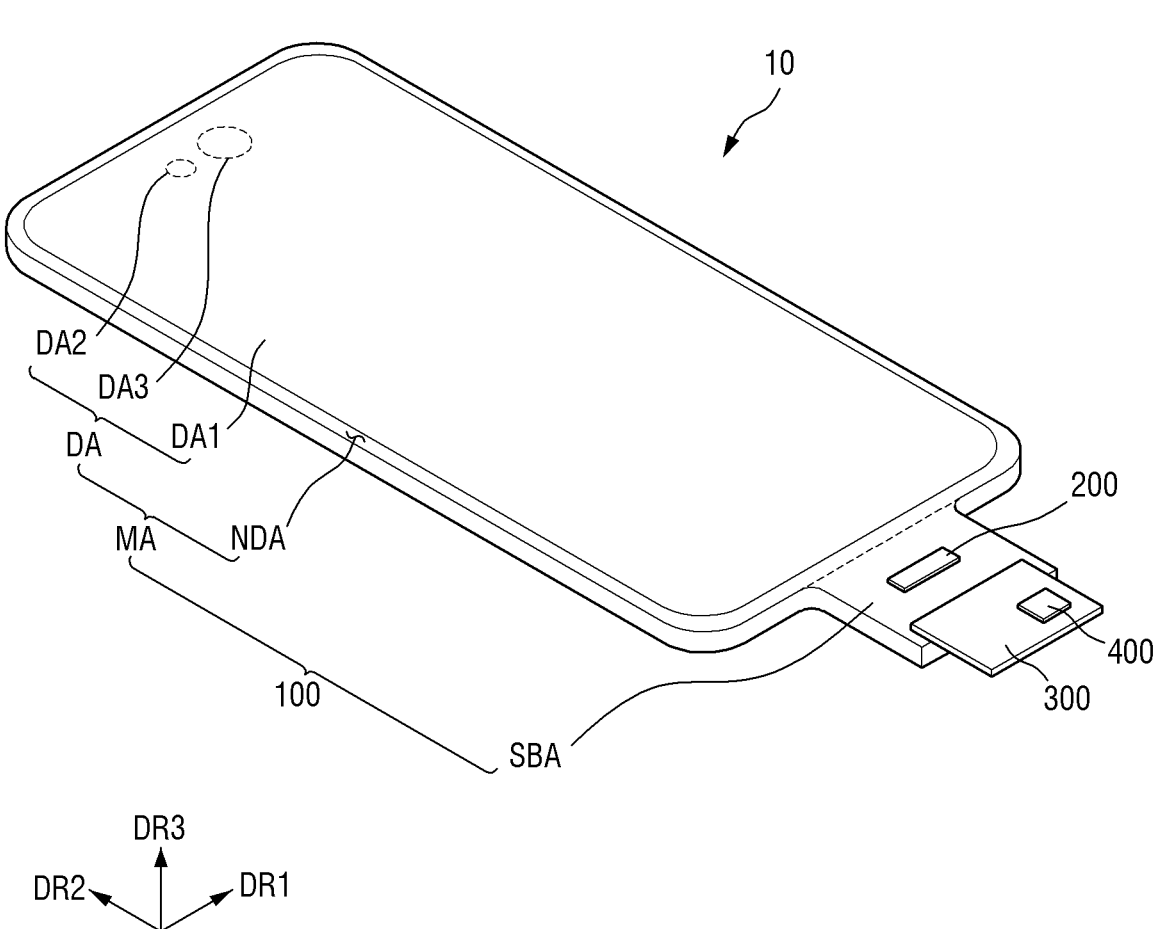
FIG. 2 is a perspective view illustrating a display device included in the electronic device according to an embodiment.

FIG. 2 is a perspective view illustrating a display device included in the electronic device according to an embodiment.

Referring to FIG. 2, an electronic device 1, according to an embodiment, may include a display device 10. The display device 10 may provide a display screen of the electronic device 1. The display device 10 may have a shape that is similar to a shape of the electronic device 1, in a plan view. For example, the display device 10 may have a shape similar to a rectangular shape having a pair of short sides extending in a first direction DR1 and a pair of long sides extending in a second direction DR2. A corner, where the short side in the first direction DR1 and the long side in the second direction DR2 meet, may be rounded with a particular degree of curvature, but the present invention is not necessarily limited thereto, and may also have a display device 10 with a rectangular shape with right-angled corners. The shape of the display device 10 in a plan view is not necessarily limited to the rectangular shape, and may be a shape similar to other polygonal shapes, a circular shape, or an elliptical shape.

The display device 10 may include a display panel 100, a display driver 200 integrated circuit, a circuit board 300, and a touch driver 400 integrated circuit.

The display panel 100 may include a main area MA and a sub-area SBA.

The main area MA may include a display area DA including pixels displaying an image and a non-display area NDA disposed around the display area DA. The display area DA may include a first display area DA1, a second display area DA2, and a third display area DA3. The display area DA may emit light from a plurality of emission areas or a plurality of opening areas. For example, the display panel 100 may include pixel circuits including switching elements, a pixel defining film defining the emission areas or the opening areas, and self-light emitting elements.

For example, the self-light emitting element may include an organic light emitting diode (LED) including an organic light emitting layer, a quantum dot LED including a quantum dot light emitting layer, an inorganic LED including an inorganic semiconductor, and/or a micro LED, but is not necessarily limited thereto.

The non-display area NDA may be an area beyond the display area DA. The non-display area NDA may be an edge area of the main area MA of the display panel 100. The non-display area NDA may include a gate driver supplying gate signals to gate lines, and fan-out lines connecting the display driver 200 and the display area DA to each other.

The sub-area SBA may be an area extending from one side of the main area MA. The sub-area SBA may include a flexible material that may be bent, folded, and/or rolled, to a noticeable extent, without the sub-area SBA cracking or otherwise sustaining damage. For example, when the sub-area SBA is bent, the sub-area SBA may at least partially overlap the main area MA in a thickness direction (third direction DR3). The sub-area SBA may include the display driver 200 and pad parts connected to the circuit board 300. In an embodiment, the sub-area SBA may be omitted, and the display driver 200 and the pad parts may be disposed in the non-display area NDA.

The display driver 200 may output signals and voltages for driving the display panel 100. The display driver 200 may supply data voltages to data lines. The display driver 200 may supply a source voltage to a power line and supply gate control signals to the gate driver. The display driver 200 may be formed as an integrated circuit (IC) and may be mounted on the display panel 100 in a chip on glass (COG) manner, a chip on plastic (COP) manner, or an ultrasonic bonding manner. As an example, the display driver 200 may be disposed in the sub-area SBA, and may at least partially overlap the main area MA in the thickness direction by bending of the sub-area SBA. As an example, the display driver 200 may be mounted on the circuit board 300.

The circuit board 300 may be attached onto the pad parts of the display panel 100 using an anisotropic conductive film (ACF). Lead lines of the circuit board 300 may be electrically connected to the pad parts of the display panel 100. The circuit board 300 may be a flexible printed circuit board, a printed circuit board, or a flexible film such as a chip on film.

The touch driver 400 may be mounted on the circuit board 300. The touch driver 400 may be connected to a touch sensing unit of the display panel 100. The touch driver 400 may supply touch driving signals to a plurality of touch electrodes of the touch sensing unit and may sense changes in capacitance between the plurality of touch electrodes. For example, the touch driving signal may be a pulse signal having a predetermined frequency. The touch driver 400 may decide whether or not an input has been generated and calculate input coordinates, based on the change in capacitance between the plurality of touch electrodes. The touch driver 400 may be formed as an integrated circuit (IC).

Figure 3:
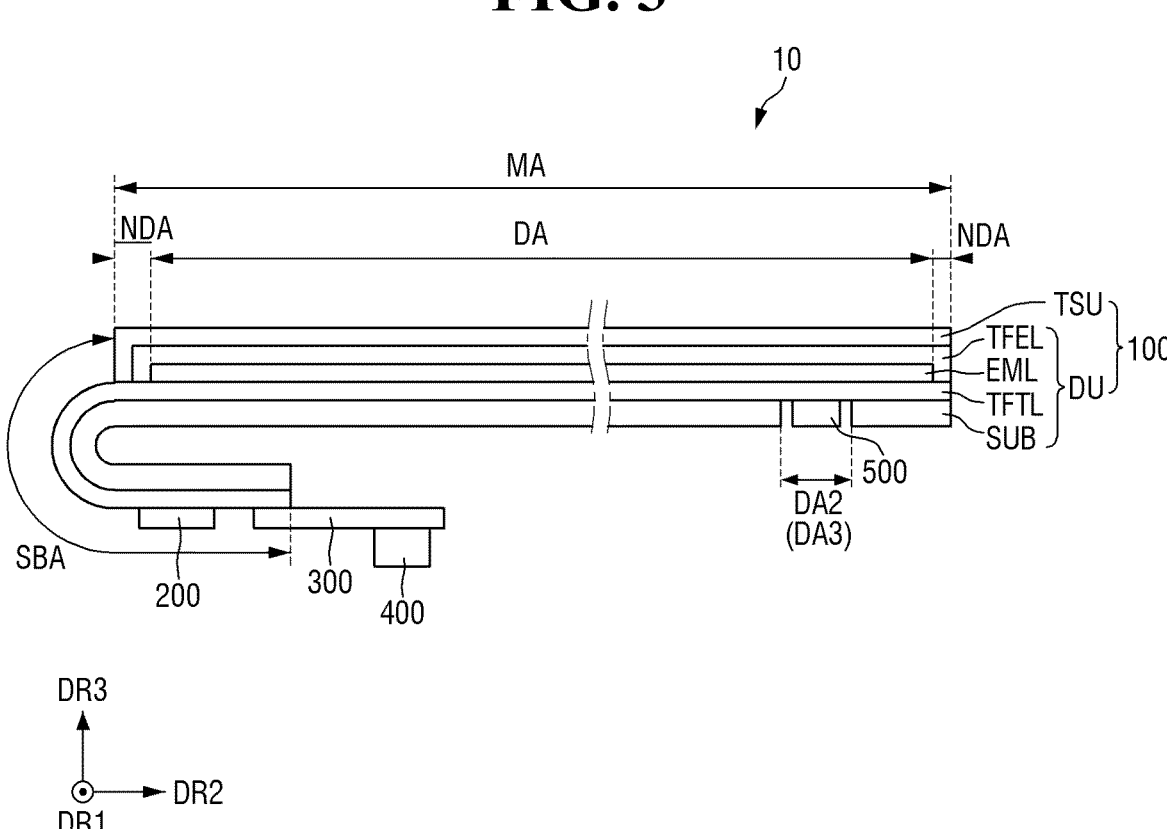
FIG. 3 is a cross-sectional view of the display device of FIG. 2.

FIG. 3 is a cross-sectional view of the display device of FIG. 2.

Referring to FIG. 3, the display panel 100 may include a display layer DU and a touch sensing layer TSU. The display layer DU may include a substrate SUB, a thin film transistor layer TFTL, a light emitting element layer EML, and a thin film encapsulation layer TFEL.

The substrate SUB may be a base substrate or a base member. The substrate SUB may be a flexible substrate that may be bent, folded, and/or rolled to a noticeable degree without cracking or otherwise sustaining damage. For example, the substrate SUB may include a polymer resin such as polyimide (PI), but is not necessarily limited thereto. In an embodiment, the substrate SUB may include a glass material or a metal material.

The thin film transistor layer TFTL may be disposed on the substrate SUB. The thin film transistor layer TFTL may include a plurality of thin film transistors constituting pixel circuits of pixels. The thin film transistor layer TFTL may further include gate lines, data lines, power lines, gate control lines, fan-out lines connecting the display driver 200 and the data lines to each other, and lead lines connecting the display driver 200 and the pad parts to each other. Each of the thin film transistors may include a semiconductor region, a source electrode, a drain electrode, and a gate electrode. For example, when the gate driver is formed on one side of the non-display area NDA of the display panel 100, the gate driver may include thin film transistors.

The thin film transistor layer TFTL may be disposed in the display area DA, the non-display area NDA, and the sub-area SBA. The thin film transistors of each of the pixels, the gate lines, the data lines, and the power lines of the thin film transistor layer TFTL may be disposed in the display area DA. The gate control lines and the fan-out lines of the thin film transistor layer TFTL may be disposed in the non-display area NDA. The lead lines of the thin film transistor layer TFTL may be disposed in the sub-area SBA.

The light emitting element layer EML may be disposed on the thin film transistor layer TFTL. The light emitting element layer EML may include a plurality of light emitting elements each including a first electrode, a second electrode, and a light emitting layer that emit light and a pixel defining film defining the pixels. The plurality of light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. When the first electrode receives a voltage through the thin film transistor of the thin film transistor layer TFTL and the second electrode receives a cathode voltage, holes and electrons may move to the organic light emitting layer through the hole transporting layer and the electron transporting layer, respectively, and may be combined with each other in the organic light emitting layer emitting light.

In an embodiment, the light emitting element may include a quantum dot light emitting diode including a quantum dot light emitting layer, an inorganic light emitting diode including an inorganic semiconductor, or a micro light emitting diode.

The display device, 10 according to an embodiment, may include a plurality of color filters CF1, CF2, and CF3 (see FIGS. 5 and 6) disposed directly on the light emitting elements of the light emitting element layer EML. Each of the color filters may selectively transmit light of a specific wavelength therethrough and block or absorb light of other wavelengths. The color filters may absorb some ambient light introduced from beyond the display device 10 to reduce reflected light by ambient light. Accordingly, the color filters may prevent distortion of colors due to ambient light reflection.

The color filters are disposed directly on the light emitting elements, and thus, the display device 10 might not require a separate substrate for the color filters. Accordingly, a thickness of the display device 10 may be relatively small.

The thin film encapsulation layer TFEL may at least partially cover an upper surface and side surfaces of the light emitting element layer EML, and may protect the light emitting element layer EML. The thin film encapsulation layer TFEL may include at least one inorganic film and at least one organic film for encapsulating the light emitting element layer EML.

The touch sensing layer TSU may be disposed on the thin film encapsulation layer TFEL. The touch sensing layer TSU may include a plurality of touch electrodes for sensing a user's touch in a capacitance manner and touch lines connecting the plurality of touch electrodes and the touch driver 400 to each other. As an example, the touch sensing layer TSU may sense the user's touch using a mutual capacitance manner or a self-capacitance manner.

In an embodiment, the touch sensing layer TSU may be disposed on a separate substrate disposed on the display layer DU. In this case, the substrate supporting the touch sensing layer TSU may be a base member encapsulating the display layer DU.

The plurality of touch electrodes of the touch sensing layer TSU may be disposed in a touch sensor area at least partially overlapping the display area DA. The touch lines of the touch sensing layer TSU may be disposed in a touch peripheral area at least partially overlapping the non-display area NDA.

In some embodiments, the display device 10 may further include an optical device 500. The optical device 500 may be disposed in the second display area DA2 or the third display area DA3. The optical device 500 may emit or receive light of infrared, ultraviolet, and/or visible light bands. For example, the optical device 500 may be an optical sensor sensing light incident on the display device 10, such as a proximity sensor, an illuminance sensor, and a camera sensor, or an image sensor.

Figure 4:
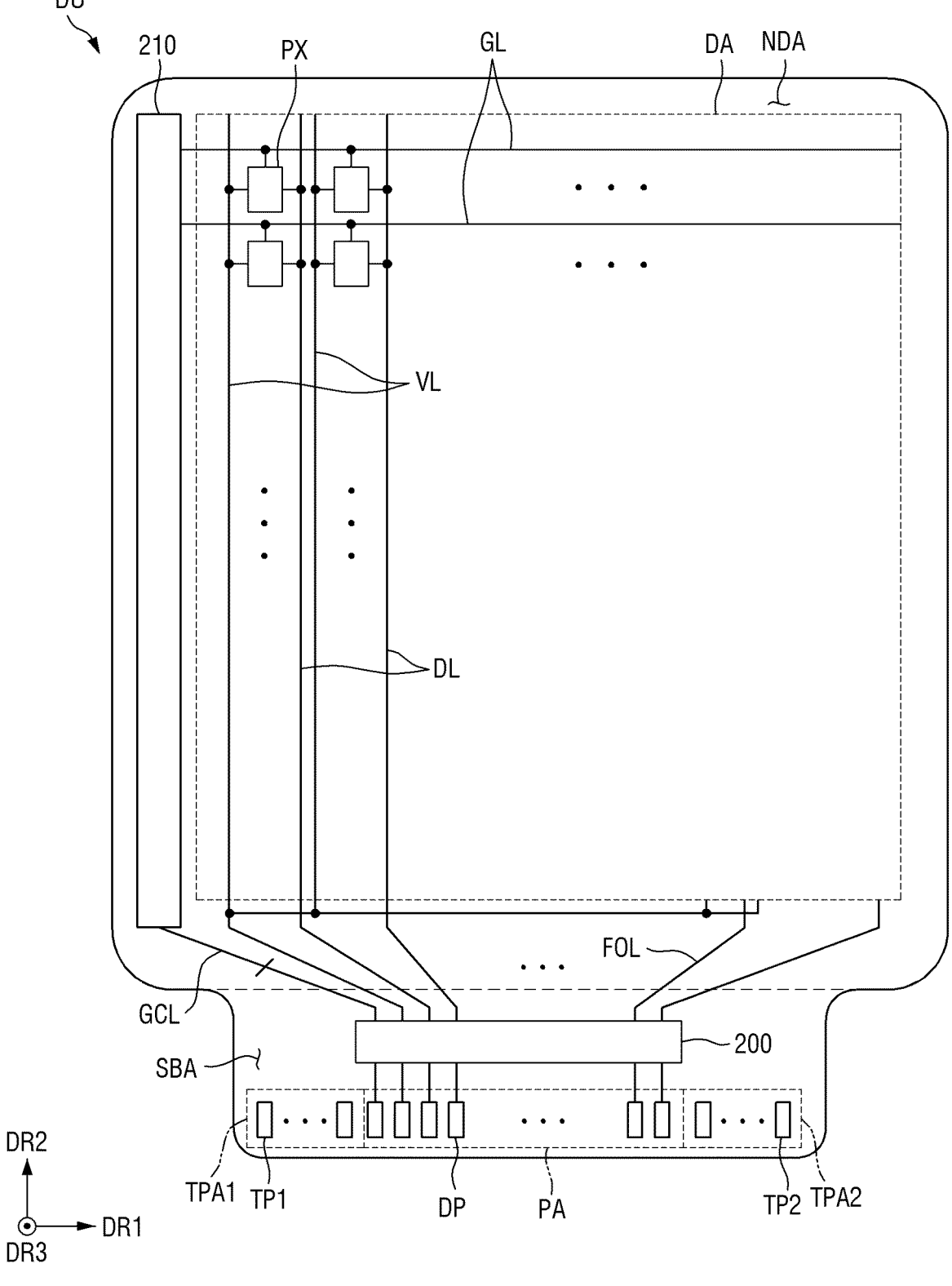
FIG. 4 is a plan view illustrating a display layer of the display device according to an embodiment.

FIG. 4 is a plan view illustrating a display layer of the display device according to an embodiment.

Referring to FIG. 4, the display layer DU may include a display area DA and a non-display area NDA.

The display area DA may be disposed at the center of the display panel 100. A plurality of pixels PX, a plurality of gate lines GL, a plurality of data lines DL, and a plurality of power lines VL may be disposed in the display area DA. Each of the plurality of pixels PX may be a minimum unit emitting light.

The plurality of gate lines GL may supply gate signals received from a gate driver 210 to the plurality of pixels PX. The plurality of gate lines GL may extend in the first direction DR1, and may be spaced apart from each other in the second direction DR2 crossing the first direction DR1.

The plurality of data lines DL may supply data voltages received from the display driver 200 to the plurality of pixels PX. The plurality of data lines DL may extend in the second direction DR2, and may be spaced apart from each other in the first direction DR1.

The plurality of power lines VL may supply a source voltage received from the display driver 200 to the plurality of pixels PX. Here, the source voltage may be a driving voltage, an initialization voltage, a reference voltage, and/or a low potential voltage. The plurality of power lines VL may extend in the second direction DR2, and may be spaced apart from each other in the first direction DR1.

The non-display area NDA may at least partially surround the display area DA. The gate driver 210, fan-out lines FOL, and gate control lines GCL may be disposed in the non-display area NDA. The gate driver 210 may generate a plurality of gate signals based on gate control signals, and may sequentially supply the plurality of gate signals to the plurality of gate lines GL according to a set order.

The fan-out lines FOL may extend from the display driver 200 to the display area DA. The fan-out lines FOL may supply the data voltages received from the display driver 200 to the plurality of data lines DL.

The gate control lines GCL may extend from the display driver 200 to the gate driver 210. The gate control lines GCL may supply the gate control signals received from the display driver 200 to the gate driver 210.

The sub-area SBA may include the display driver 200, a pad area PA, and first and second touch pad areas TPA1 and TPA2.

The display driver 200 may output signals and voltages for driving the display panel 100 to the fan-out lines FOL. The display driver 200 may supply the data voltages to the data lines DL through the fan-out lines FOL. The data voltages may be supplied to the plurality of pixels PX, and may control luminance of the plurality of pixels PX. The display driver 200 may supply the gate control signals to the gate driver 210 through the gate control lines GCL.

The pad area PA, the first touch pad area TPA1, and the second touch pad area TPA2 may be disposed at an edge of the sub-area SBA. The pad area PA, the first touch pad area TPA1, and the second touch pad area TPA2 may be electrically connected to the circuit board 300 using a material such as an anisotropic conductive film or a self assembly anisotropic conductive paste (SAP).

The pad area PA may include a plurality of display pad parts DP. The plurality of display pad parts DP may be connected to a graphic system through the circuit board 300. The plurality of display pad parts DP may be connected to the circuit board 300 to receive digital video data, and may supply the digital video data to the display driver 200.

Figure 5:
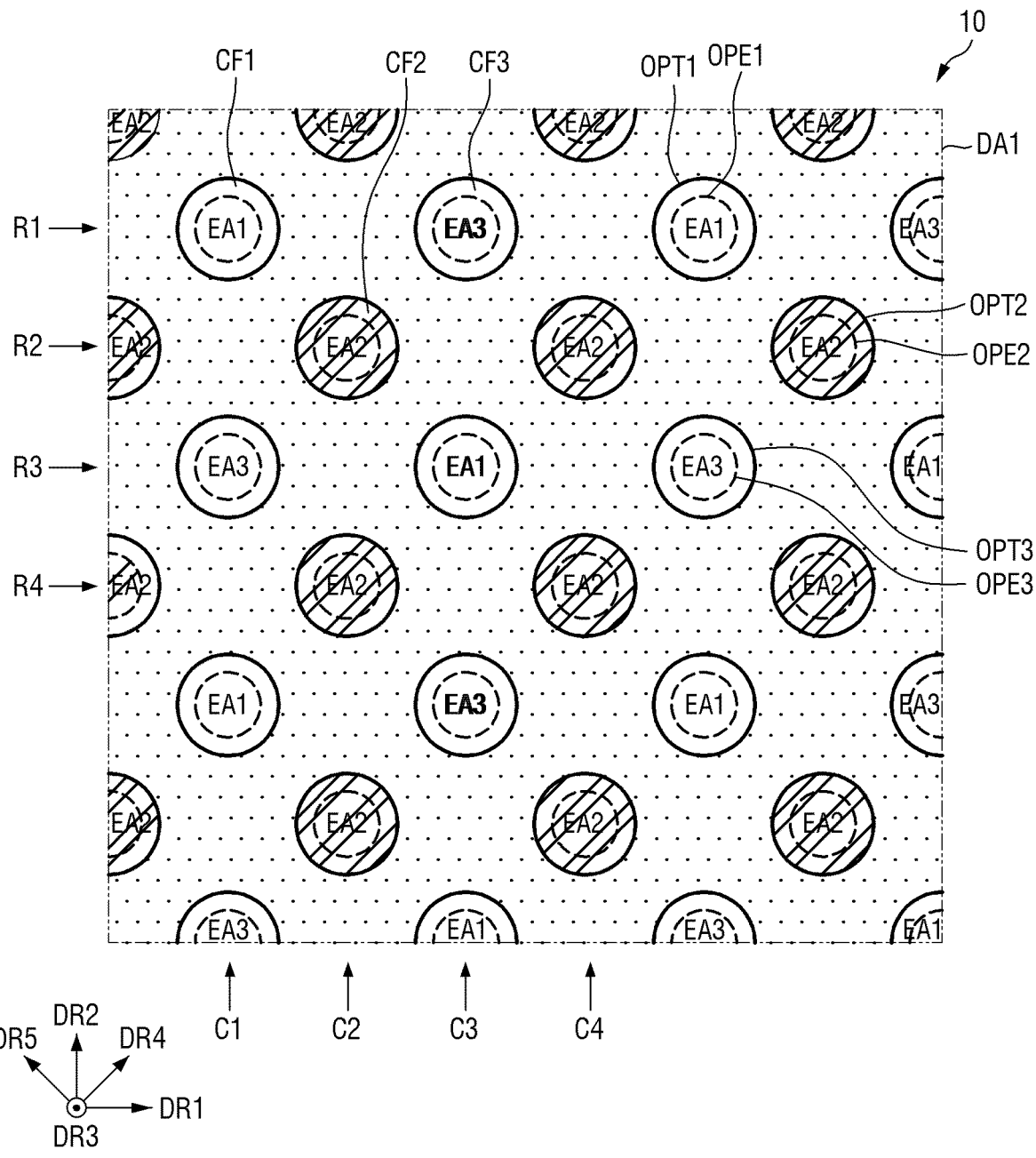
FIG. 5 is a plan view illustrating layouts of emission areas and color filters in a display area of the display device according to an embodiment.

FIG. 5 is a plan view illustrating layouts of emission areas and color filters in a display area of the display device, according to an embodiment.

Referring to FIG. 5, the display device 10 may include a plurality of emission areas EA1, EA2, and EA3 disposed in the display area DA. The display area DA illustrated in FIG. 5 is the first display area DA1, and the plurality of emission areas EA1, EA2, and EA3 may be disposed in the first display area DA1. However, the plurality of emission areas EA1, EA2, and EA3 may also be disposed in the second display area DA2 and the third display area DA3 of the display area DA.

The emission areas EA1, EA2, and EA3 may include first emission areas EA1, second emission areas EA2, and third emission areas EA3 that each emit light of different colors. The first to third emission areas EA1, EA2, and EA3 may emit red, green, or blue light, respectively, and colors of the light emitted from the respective emission areas EA1, EA2, and EA3 may be different depending on a type of light emitting element ED1, ED2, and ED3 (see FIG. 6) disposed at a light emitting element layer EML. In an embodiment, the first emission area EA1 may emit a first light, which is red light, the second emission area EA2 may emit a second light, which is green light, and the third emission area EA3 may emit a third light, which is blue light. However, the disclosure is not necessarily limited thereto.

The plurality of emission areas EA1, EA2, and EA3 may be disposed in a PENTILE™ type, where PENTILE™ is an arrangement of luminous areas manufactured by SAMSUNG, for example, a diamond PENTILE™ type. For example, the first emission areas EA1 and the third emission areas EA3 may be spaced apart from each other in the first direction DR1, and may be alternately disposed in the first direction DR1 and the second direction DR2. In an arrangement of the emission areas EA1, EA2, and EA3, the first emission areas EA1 and the third emission areas EA3 may be alternately disposed in the first direction DR1 in a first row R1 and a third row R3. The first emission areas EA1 and the third emission areas EA3 may be alternately disposed in the second direction DR2 in a first column C1 and a third column C3.

The second emission areas EA2 may be spaced apart from other adjacent second emission areas EA2 in the first direction DR1 and the second direction DR2, and may be spaced apart from adjacent first emission areas EA1 and third emission areas EA3 in a fourth direction DR4 or a fifth direction DR5. A plurality of second emission areas EA2 may be repeatedly disposed along the first and second directions DR1 and DR2, and the second emission areas EA2 and the first emission areas EA1 or the second emission areas EA2 and the third emission areas EA3 may be alternately disposed along the fourth direction DR4 or the fifth direction DR5. In the arrangement of the emission areas EA1, EA2, and EA3, the second emission areas EA2 may be repeatedly disposed in the first direction DR1 in a second row R2 and a fourth row R4, and the second emission areas EA2 may be repeatedly disposed in the second direction DR2 in a second column C2 and a fourth column C4.

The first to third emission areas EA1, EA2, and EA3 may be defined, respectively, by a plurality of openings OPE1, OPE2, and OPE3 formed in a bank structure BNS (see FIG. 6) of a light emitting element layer EML. For example, the first emission area EA1 may be defined by a first opening OPE1 of the pixel defining film, the second emission area EA2 may be defined by a second opening OPE2 of the pixel defining film, and the third emission area EA3 may be defined by a third opening OPE3 of the pixel defining film.

Areas of the emission areas EA1, EA2, and EA3 may change depending on sizes of the openings OPE1, OPE2, and OPE3 of the bank structure. An intensity of the light emitted from the emission areas EA1, EA2, and EA3 may change depending on the areas of the emission areas EA1, EA2, and EA3, and a color feeling of a screen displayed on the display device 10 or the electronic device 1 may be controlled by adjusting the areas of the emission area EA1, EA2, and EA3. In an embodiment, areas or sizes of the first to third emission areas EA1, EA2, and EA3 may be the same as each other. In an embodiment of FIG. 5, areas or diameters of the first emission area EA1, the second emission area EA2, and the third emission area EA3 may be the same as each other.

However, the disclosure is not necessarily limited thereto. The areas of the emission areas EA1, EA2, and EA3 may be freely adjusted according to a color feeling of the screen required by the display device 10 and the electronic device 1. In addition, the areas of the emission areas EA1, EA2, and EA3 may be related to light efficiency, a lifespan of light emitting elements ED, and the like, and may have a trade-off relationship with ambient light reflection. The areas of the emission areas EA1, EA2, and EA3 may be adjusted in consideration of the above factors. For example, in the display device 10, an area of the third emission area EA3 may be greater in size than areas of the first emission area EA1 and the second emission area EA2, and an area of the first emission area EA1 may be greater in size than an area of the second emission area EA2.

In the display device 10 having a layout of the emission areas EA1, EA2, and EA3 as illustrated in FIG. 5, one first emission area EA1, two second emission areas EA2, and one third emission area EA3 disposed adjacent to each other may form one pixel group. One pixel group may include the emission areas EA1, EA2, and EA3 emitting light of different colors to express a white gradation. However, the disclosure is not necessarily limited thereto, and a combination of the emission areas EA1, EA2, and EA3 constituting one pixel group may be variously modified depending on an arrangement of the emission areas EA1, EA2, and EA3, colors of the light emitted by the emission areas EA1, EA2, and EA3, and the like.

The display device 10 may include a plurality of color filters CF1, CF2, and CF3 disposed on the emission areas EA1, EA2, and EA3. The plurality of color filters CF1, CF2, and CF3 may correspond to the emission areas EA1, EA2, and EA3, respectively. For example, the color filters CF1, CF2, and CF3 may be disposed in a plurality of opening holes OPT1, OPT2, and OPT3 of a light blocking layer BM corresponding to the emission areas EA1, EA2, and EA3, or the openings OPE1, OPE2, and OPE3, respectively. The opening holes OPT1, OPT2, and OPT3 of the light blocking layer may at least partially overlap the openings OPE1, OPE2, and OPE3, respectively, and may form light emitting areas through which the light emitted from the emission areas EA1, EA2, and EA3 is emitted. Each of the color filters CF1, CF2, and CF3 may have a greater area than each of the openings OPE1, OPE2, and OPE3, and may completely cover each of the light emitting areas formed by the opening holes OPT1, OPT2, and OPT3 of the light blocking layer BM.

The color filters CF1, CF2, and CF3 may include first color filters CF1, second color filters CF2, and third color filters CF3 corresponding to different emission areas EA1, EA2, and EA3, respectively. The color filters CF1, CF2, and CF3 may include colorants such as dyes or pigments absorbing light of wavelength bands other than light of a specific wavelength band, and may correspond to the colors of the light emitting from the emission areas EA1, EA2, and EA3. For example, the first color filter CF1 may be a red color filter at least partially overlapping the first emission area EA1 and transmitting just the first light, which is the red light, therethrough. The second color filter CF2 may be a green color filter at least partially overlapping the second emission area EA2 and transmitting just the second light, which is the green light, therethrough, and the third color filter CF3 may be a blue color filter at least partially overlapping the third emission area EA3 and transmitting just the third light, which is the blue light, therethrough.

Similar to the layout of the emission areas EA1, EA2, and EA3, the color filters CF1, CF2, and CF3 may be disposed in a PENTILE™ type, for example, a diamond PENTILE™ type. For example, the first color filters CF1 and the third color filters CF3 may be alternately disposed in the first direction DR1 and the second direction DR2. In an arrangement of the color filters CF1, CF2, and CF3, the first color filters CF1 and the third color filters CF3 may be alternately disposed in the first direction DR1 in the first row R1 and the third row R3. The first color filters CF1 and the third color filters CF3 may be alternately disposed in the second direction DR2 in the first column C1 and the third column C3.

The second color filters CF2 may be spaced apart from other adjacent second color filters CF2 in the first direction DR1 and the second direction DR2, and may be spaced apart from adjacent first color filters CF1 and third color filters CF3 in the fourth direction DR4 or the fifth direction DR5. A plurality of second color filters CF2 may be repeatedly disposed along the first and second directions DR1 and DR2, and the second color filters CF2 and the first color filters CF1 or the second color filters CF2 and the third color filters CF3 may be alternately disposed along the fourth direction DR4 or the fifth direction DR5. In the arrangement of the color filters CF1, CF2, and CF3, the second color filters CF2 may be repeatedly disposed in the first direction DR1 in the second row R2 and the fourth row R4, and the second color filters CF2 may be repeatedly disposed in the second direction DR2 in the second column C2 and the fourth column C4.

Figure 7:
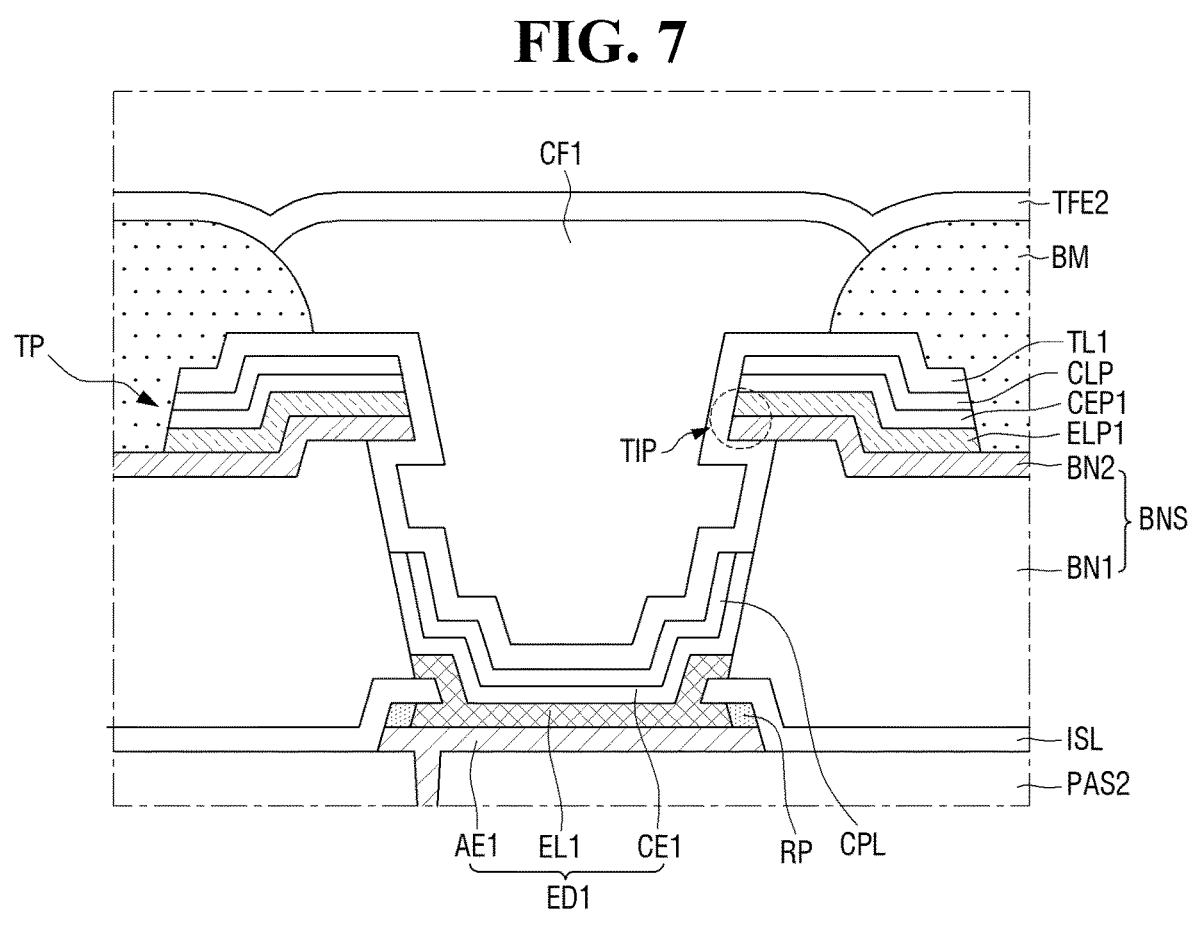

FIG. 6 is a cross-sectional view illustrating a portion of the display device according to an embodiment. FIG. 7 is an enlarged view illustrating a first emission area of FIG. 6. FIG. 6 is a partial cross-sectional view of the display device 10, and illustrates cross-sections of the substrate SUB, the thin film transistor layer TFTL, the light emitting element layer EML, and the thin film encapsulation layer TFEL of the display layer DU. FIG. 7 illustrates a first light emitting element ED1 disposed in a first emission area EA1 and a portion of a bank structure BNS around the first light emitting element ED1 in FIG. 6.

Referring to FIGS. 6 and 7, and in addition, to FIG. 5, the display panel 100 of the display device 10 may include the display layer DU. The display layer DU may include the substrate SUB, the thin film transistor layer TFTL, the light emitting element layer EML, the plurality of color filters CF1, CF2, and CF3, the light blocking layer BM, and the thin film encapsulation layer TFEL. The display panel 100 may include the color filters CF1, CF2, and CF3 disposed directly on light emitting elements ED.

The substrate SUB may be a base substrate or a base member. The substrate SUB may be a flexible substrate that may be bent, folded, and/or rolled to a noticeable degree without cracking or otherwise sustaining damage. As an example, the substrate SUB may include a polymer resin such as polyimide (PI), but is not necessarily limited thereto. As an example, the substrate SUB may include a glass material or a metal material.

The thin film transistor layer TFTL may include a first buffer layer BF1, a lower metal layer BML, a second buffer layer BF2, thin film transistors TFT, a gate insulating layer GI, a first interlayer insulating layer ILD1, capacitor electrodes CPE, a second interlayer insulating layer ILD2, first connection electrodes CNE1, a first passivation layer PAS1, second connection electrodes CNE2, and a second passivation layer PAS2.

The first buffer layer BF1 may be disposed on the substrate SUB. The first buffer layer BF1 may include an inorganic film capable of preventing penetration of air or moisture. For example, the first buffer layer BF1 may include a plurality of inorganic films that are alternately stacked.

The lower metal layer BML may be disposed on the first buffer layer BF1. For example, the lower metal layer BML may be formed as a single layer or multiple layers including molybdenum (Mo), aluminum (Al), chromium (Cr), gold (Au), titanium (Ti), nickel (Ni), neodymium (Nd), and/or copper (Cu), or alloys thereof.

The second buffer layer BF2 may at least partially cover the first buffer layer BF1 and the lower metal layer BML. The second buffer layer BF2 may include an inorganic film capable of preventing penetration of air or moisture. For example, the second buffer layer BF2 may include a plurality of inorganic films that are alternately stacked.

The thin film transistor TFT may be disposed on the second buffer layer BF2, and may constitute a pixel circuit of each of the plurality of pixels. For example, the thin film transistor TFT may be a driving transistor or a switching transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may at least partially overlap the lower metal layer BML and the gate electrode GE in the thickness direction, and may be insulated from the gate electrode GE by the gate insulating layer GI. A material of the semiconductor layer ACT in portions of the semiconductor layer ACT may become conductors of electricity to form the source electrode SE and the drain electrode DE.

The gate electrode GE may be disposed on the gate insulating layer GI. The gate electrode GE may at least partially overlap the semiconductor layer ACT with the gate insulating layer GI interposed therebetween.

The gate insulating layer GI may be disposed on the semiconductor layer ACT. For example, the gate insulating layer GI may at least partially cover the semiconductor layer ACT and the second buffer layer BF2, and may insulate the semiconductor layer ACT and the gate electrode GE from each other. The gate insulating layer GI may include a contact hole through which the first connection electrode CNE1 penetrates.

The first interlayer insulating layer ILD1 may at least partially cover the gate electrode GE and the gate insulating layer GI. The first interlayer insulating layer ILD1 may include a contact hole through which the first connection electrode CNE1 penetrates. The contact hole of the first interlayer insulating layer ILD1 may be connected to the contact hole of the gate insulating layer GI and a contact hole of the second interlayer insulating layer ILD2.

The capacitor electrode CPE may be disposed on the first interlayer insulating layer ILD1. The capacitor electrode CPE may at least partially overlap the gate electrode GE in the thickness direction. The capacitor electrode CPE and the gate electrode GE may form a capacitor having a particular capacitance.

The second interlayer insulating layer ILD2 may at least partially cover the capacitor electrode CPE and the first interlayer insulating layer ILD1. The second interlayer insulating layer ILD2 may include the contact hole through which the first connection electrode CNE1 penetrates. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT and the second connection electrode CNE2 to each other. The first connection electrode CNE1 may be inserted into the contact holes formed in the second interlayer insulating layer ILD2, the first interlayer insulating layer ILD1, and the gate insulating layer GI to be in contact with the drain electrode DE of the thin film transistor TFT.

The first passivation layer PAS1 may at least partially cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 penetrates.

The second connection electrode CNE2 may be disposed on the first passivation layer PAS1. The second connection electrodes CNE2 may electrically connect the first connection electrodes CNE1 and pixel electrodes AE1, AE2, and AE3 of the light emitting elements ED to each other. The second connection electrode CNE2 may be inserted into the contact hole formed in the first passivation layer PAS1 to be in contact with the first connection electrode CNE1.

The second passivation layer PAS2 may at least partially cover the second connection electrode CNE2 and the first passivation layer PAS1. The second passivation layer PAS2 may include contact holes through which the pixel electrodes AE1, AE2, and AE3 of the light emitting elements ED penetrate.

The light emitting element layer EML may be disposed on the thin film transistor layer TFTL. The light emitting element layer EML may include the light emitting elements ED and a plurality of bank structures BNS. The light emitting elements ED may include the pixel electrodes AE1, AE2, and AE3, light emitting layers EL1, EL2, and EL3, and common electrodes CE1, CE2, and CE3.

FIG. 7 is an enlarged view illustrating a first emission area of FIG. 6.

Referring to FIG. 7 in addition FIG. 6, the display device 10 may include a plurality of emission areas EA1, EA2, and EA3 disposed in the display area DA. The emission areas EA1, EA2, and EA3 may include a first emission area EA1, a second emission area EA2, and a third emission areas EA3 that emit light of different colors. The first to third emission areas EA1, EA2, and EA3 may emit red, green, or blue light, respectively, and colors of the light emitted from the respective emission areas EA1, EA2, and EA3 may be different depending on types of the light emitting elements ED disposed in the light emitting element layer EML. In an embodiment, the first emission area EA1 may emit a first light, which is red light, the second emission area EA2 may emit a second light, which is green light, and the third emission area EA3 may emit a third light, which is blue light. However, the disclosure is not necessarily limited thereto.

The first to third emission areas EA1, EA2, and EA3 may be defined, respectively, by a plurality of openings OPE1, OPE2, and OPE3 formed in the bank structure BNS of the light emitting element layer EML. For example, the first emission area EA1 may be defined by a first opening OPE1 of the bank structure BNS, the second emission area EA2 may be defined by a second opening OPE2 of the bank structure BNS, and the third emission area EA3 may be defined by a third opening OPE3 of the bank structure BNS.

In an embodiment, areas or sizes of the first to third emission areas EA1, EA2, and EA3 may be the same as each other. For example, in the display device 10, the openings OPE1, OPE2, and OPE3 of the bank structures BNS may have the same diameter, and the first emission area EA1, the second emission area EA2, and the third emission area EA3 may have the same area. However, the disclosure is not necessarily limited thereto. In the display device 10, areas or sizes of the first to third emission areas EA1, EA2, and EA3 may be different from each other. For example, an area of the second emission area EA2 may be greater in size than areas of the first emission area EA1 and the third emission area EA3, and an area of the third emission area EA3 may be greater in size than an area of the first emission area EA1. An intensity of light emitted from the emission areas EA1, EA2, and EA3 may change depending on the areas of the emission areas EA1, EA2, and EA3, and a color feeling of a screen displayed on the display device 10 or the electronic device 1 may be controlled by adjusting the areas of the emission area EA1, EA2, and EA3. In an embodiment of FIG. 5, it has been illustrated that the areas of the emission areas EA1, EA2, and EA3 are the same as each other, but the disclosure is not necessarily limited thereto. The areas of the emission areas EA1, EA2, and EA3 may be freely adjusted according to a color feeling of the screen required by the display device 10 and the electronic device 1. In addition, the areas of the emission areas EA1, EA2, and EA3 may be related to light efficiency, a lifespan of light emitting elements ED, and the like, and may have a trade-off relationship with ambient light reflection. The areas of the emission areas EA1, EA2, and EA3 may be adjusted in consideration of the above factors.

In the display device 10, one first emission area EA1, one second emission area EA2, and one third emission area EA3 disposed adjacent to each other may form one pixel group. One pixel group may include the emission areas EA1, EA2, and EA3 emitting light of different colors to express a white gradation. However, the disclosure is not necessarily limited thereto, and a combination of the emission areas EA1, EA2, and EA3 constituting one pixel group may be variously modified depending on an arrangement of the emission areas EA1, EA2, and EA3, colors of the light emitted by the emission areas EA1, EA2, and EA3, and the like.

The display device 10 may include a plurality of light emitting elements ED1, ED2, and ED3 disposed in different emission areas EA1, EA2, and EA3. The light emitting elements ED1, ED2, and ED3 may include a first light emitting element ED1 disposed in the first emission area EA1, a second light emitting element ED2 disposed in the second emission area EA2, and a third light emitting element ED3 disposed in the third emission area EA3. The light emitting elements ED1, ED2, and ED3 may include pixel electrodes AE1, AE2, and AE3, light emitting layers EL1, EL2, and EL3, and common electrodes CE1, CE2, and CE3, respectively, and the light emitting elements ED1, ED2, and ED3 disposed in the different emission areas EA1, EA2, and EA3 may emit light of different colors depending on materials of the light emitting layers EL1, EL2, and EL3, respectively. For example, the first light emitting element ED1 disposed in the first emission area EA1 may emit red light, which is light of a first color, the second light emitting element ED2 disposed in the second emission area EA2 may emit green light, which is light of a second color, and the third light emitting element ED3 disposed in the third emission area EA3 may emit blue light, which is light of a third color. The first to third emission areas EA1, EA2, and EA3 constituting one pixel may include the light emitting elements ED1, ED2, and ED3 emitting the light of the different colors to express a white gradation.

The pixel electrodes AE1, AE2, and AE3 may be disposed on the second passivation layer PAS2. Each of the pixel electrodes AE1, AE2, and AE3 may at least partially overlap any one of the openings OPE1, OPE2, and OPE3 of the bank structure BNS. The pixel electrodes AE1, AE2, and AE3 may be electrically connected to the drain electrodes DE of the thin film transistors TFT through the first and second connection electrodes CNE1 and CNE2.

The pixel electrodes AE1, AE2, and AE3 may be disposed in the plurality of emission areas EA1, EA2, and EA3, respectively. The pixel electrodes AE1, AE2, and AE3 may include a first pixel electrode AE1 disposed in the first emission area EA1, a second pixel electrode AE2 disposed in the second emission area EA2, and a third pixel electrode AE3 disposed in the third emission area EA3. The first pixel electrode AE1, the second pixel electrode AE2, and the third pixel electrode AE3 may be spaced apart from each other on the second passivation layer PAS2, respectively. The pixel electrodes AE1, AE2, and AE3 may be disposed in the different emission areas EA1, EA2, and EA3, respectively, to form the light emitting elements ED1, ED2, and ED3 emitting the light of the different colors, respectively.

An inorganic insulating layer ISL may be disposed on the second passivation layer PAS2 and the pixel electrodes AE1, AE2, and AE3. The inorganic insulating layer ISL may be entirely disposed on the second passivation layer PAS2, but may expose portions of upper surfaces of the pixel electrodes AE1, AE2, and AE3 while partially overlapping the pixel electrodes AE1, AE2, and AE3. The inorganic insulating layer ISL may expose the pixel electrodes AE1, AE2, and AE3 in portions thereof overlapping the openings OPE1, OPE2, and OPE3 of the bank structure BNS, and the light emitting layers EL1, EL2, and EL3 disposed on the pixel electrodes AE1, AE2, and AE3, respectively, may be disposed directly on the pixel electrodes AE1, AE2, and AE3, respectively. The inorganic insulating layer ISL may include an inorganic insulating material. As an example, the inorganic insulating layer ISL may include aluminum oxide, titanium oxide, tantalum oxide, hafnium oxide, zinc oxide, silicon oxide, silicon nitride, and/or silicon oxynitride.

According to an embodiment, the inorganic insulating layer ISL may be disposed on the pixel electrodes AE1, AE2, and AE3, but may be spaced apart from the upper surfaces of the pixel electrodes AE1, AE2, and AE3. The inorganic insulating layer ISL might not be in direct contact with the pixel electrodes AE1, AE2, and AE3 while partially overlapping the pixel electrodes AE1, AE2, and AE3, and portions of the light emitting layers EL1, EL2, and EL3 of the light emitting elements ED1, ED2, and ED3 may be disposed between the inorganic insulating layer ISL and the pixel electrodes AE1, AE2, and AE3. In manufacturing processes of the display device 10, a sacrificial layer SFL (see FIG. 9) may be disposed on the pixel electrodes AE1, AE2, and AE3 before the inorganic insulating layer ISL is formed. The inorganic insulating layer ISL may at least partially cover portions of the sacrificial layer, and may then be spaced apart from the upper surfaces of the pixel electrodes AE1, AE2, and AE3 while the sacrificial layer is removed. Thereafter, in a deposition process of the light emitting layers EL1, EL2, and EL3, portions of the inorganic insulating layer ISL may be disposed on the light emitting layers EL1, EL2, and EL3 while materials forming the light emitting layers EL1, EL2, and EL3 filling spaces between the inorganic insulating layer ISL and the pixel electrodes AE1, AE2, and AE3. However, the inorganic insulating layer ISL may be in direct contact with side surfaces of the pixel electrodes AE1, AE2, and AE3.

The display device 10 may include the plurality of bank structures BNS disposed on the thin film transistor layer TFTL or the substrate SUB and including the plurality of openings OPE1, OPE2, and OPE3. The bank structure BNS may have a structure in which bank layers BN1 and BN2 including different materials are sequentially stacked, and may include the plurality of openings OPE1, OPE2, and OPE3 forming the emission areas EA1, EA2, and EA3. The light emitting elements ED1, ED2, and ED3 of the display device 10 may at least partially overlap the openings OPE1, OPE2, and OPE3 of the bank structure BNS.

The bank structure BNS may include a first bank layer BN1 disposed on the inorganic insulating layer ISL and a second bank layer BN2 disposed on the first bank layer BN1.

According to an embodiment, the first bank layer BN1 and the second bank layer BN2 may include different metal materials, and the second bank layer BN2 of the bank structure BNS may include tips TIP protruding from the first bank layer BN1 toward the openings OPE1, OPE2, and OPE3. In the bank structure BNS, sides of the first bank layer BN1 may have a shape in which they are recessed inward from sides of the second bank layer BN2. In the bank structure BNS, the first bank layer BN1 may have a greater thickness than the second bank layer BN2, and the second bank layer BN2 may have a relatively small thickness and include the tips TIP formed in a manufacturing process. The second bank layer BN2 has a shape in which it protrudes more than the first bank layer BN1 toward the openings OPE1, OPE2, and OPE3, and accordingly, inner sidewalls of the openings OPE1, OPE2, and OPE3 of the bank structure BNS may have undercuts formed under the tips TIP of the second bank layer BN2.

A sidewall shape of the bank structure BNS may be a structure formed due to a difference between etch rates of the first bank layer BN1 and the second bank layer BN2 in an etching process because the first bank layer BN1 and the second bank layer BN2 include different materials. According to an embodiment, the second bank layer BN2 may include a material having an etch rate slower than that of the first bank layer BN1, and the first bank layer BN1 may be further etched in a process of forming the openings OPE1, OPE2, and OPE3 of the bank structure BNS, such that the undercuts may be formed under the tips TIP of the second bank layer BN2. In an embodiment, the first bank layer BN1 may include a metal material having a high electrical conductivity, and the second bank layer BN2 may include a metal material having a low reflectivity of light. As an example, the first bank layer BN1 may include aluminum (Al), and the second bank layer BN2 may include titanium (Ti). The bank structure BNS may have a structure in which an Al layer and a Ti layer are stacked on the inorganic insulating layer ISL, and the tips TIP may be formed in the Ti layer of the second bank layer BN2.

The bank structure BNS may include the openings OPE1, OPE2, and OPE3 forming the emission areas EA1, EA2, and EA3, and the light blocking layer BM may be disposed on the bank structure BNS. The uppermost layer of the bank structure BNS may include a material having a low reflectivity of light to reduce ambient light reflection. In addition, in the bank structure BNS, the first bank layer BN1 may be electrically connected to the common electrodes CE1, CE2, and CE3 of different light emitting elements ED1, ED2, and ED3. The common electrodes CE1, CE2, and CE3 of the light emitting elements ED1, ED2, and ED3 disposed in the different emission areas EA1, EA2, and EA3 are not directly connected to each other, but may be electrically connected to each other through the first bank layer BN1 of the bank structure BNS.

In order to form the pixel defining film forming the emission areas EA1, EA2, and EA3 using an organic material or form the light emitting layers EL1, EL2, and EL3 of the light emitting elements ED1, ED2 and ED3 for each of the emission areas EA1, EA2, and EA3 in the manufacturing processes of the display device 10, a mask process is required. The display device may require a structure for mounting a mask in order to perform the mask process, or a relatively large area of the non-display area NDA may be required in order to control dispersion according to the mask process. If such a mask process is minimized, a component such as the structure for mounting the mask may be omitted from the display device 10, and the area of the non-display area NDA for controlling the dispersion may be minimized.

The display device 10, according to an embodiment, includes the bank structure BNS forming the emission areas EA1, EA2, and EA3, and thus, the light emitting elements ED1, ED2, and ED3 may be formed by deposition and etching processes instead of the mask process. In addition, the bank structure BNS includes the first bank layer BN1 and the second bank layer BN2 including the different metal materials to have a structure in which the inner sidewalls of the openings OPE1, OPE2, and OPE3 include the tips TIP, and accordingly, it is possible to individually form different layers in the different emission areas EA1, EA2, and EA3 even through the deposition process. For example, even though the light emitting layers EL1, EL2, and EL3 and the common electrodes CE1, CE2, and CE3 of the light emitting elements ED1, ED2, and ED3 are formed by a deposition process that does not use the mask, deposited materials may be disconnected from each other rather than being connected to each other between the openings OPE1, OPE2, and OPE3 by the tips TIP of the second bank layer BN2 formed on the inner sidewalls of the openings OPE1, OPE2, and OPE3. It is possible to form individually the different layers in the different emission areas EA1, EA2, and EA3 through a process of forming a material for forming a specific layer on the entire surface of the display device 10 and then etching and removing a layer formed in unwanted areas. In the display device 10, through the deposition and etching processes without using the mask process, the different light emitting elements ED1, ED2, and ED3 may be formed for each emission area EA1, EA2, and EA3, the component may be omitted from the display device 10, and the area of the non-display area NDA may be minimized.

A first encapsulation layer TFE1 of the thin film encapsulation layer TFEL may be disposed on the common electrodes CE1, CE2, and CE3 of the light emitting elements ED1, ED2, and ED3. The first encapsulation layer TFE1 may include a first inorganic layer TL1 disposed on the first light emitting element ED1, a second inorganic layer TL2 disposed on the second light emitting element ED2, and a third inorganic layer TL3 disposed on the third light emitting element ED3. After the first to third inorganic layers TL1, TL2, and TL3 are entirely formed on the bank structure BNS, the first to third inorganic layers TL1, TL2, and TL3 may cover just the light emitting elements ED1, ED2, and ED3 in the respective emission areas EA1, EA2, and EA3 and organic patterns ELP1, ELP2, and ELP3 and electrode patterns CEP1, CEP2, and CEP3, but might not be disposed between the emission areas EA1, EA2, and EA3. The inorganic layers TL1, TL2, and TL3 may be formed in such a shape by forming the inorganic layers TL1, TL2, and TL3 so as to completely cover the bank structure BNS and then partially patterning the inorganic layers TL1, TL2, and TL3.

The display device 10 may include patterns that are traces according to a shape and a deposition process of the bank structure BNS. The patterns may be formed simultaneously with the light emitting layers EL1, EL2, and EL3 and the common electrodes CE1, CE2, and CE3 of the light emitting elements ED1, ED2, and ED3, and may remain on the bank structure BNS. Hereinafter, structures of the light emitting layers EL1, EL2, and EL3 and the common electrodes CE1, CE2, and CE3, and the patterns will be described.

The light emitting layers EL1, EL2, and EL3 may be disposed on the pixel electrodes AE1, AE2, and AE3. The light emitting layers EL1, EL2, and EL3 may be organic light emitting layers made of an organic material, and may be formed on the pixel electrodes AE1, AE2, and AE3 through a deposition process. When the thin film transistors TFT apply a predetermined voltage to the pixel electrodes AE1, AE2, and AE3 of the light emitting elements ED1, ED2, and ED3 and the common electrodes CE1, CE2, and CE3 of the light emitting elements ED1, ED2, and ED3 receives a common voltage or a cathode voltage, holes and electrons may move to the light emitting layers EL1, EL2, and EL3 through hole transporting layers and electron transporting layers, respectively, and may be combined with each other in the light emitting layers EL1, EL2, and EL3 emitting light.

The light emitting layers EL1, EL2, and EL3 may include a first light emitting layer EL1, a second light emitting layer EL2, and a third light emitting layer EL3 disposed in the different emission areas EA1, EA2, and EA3. The first light emitting layer EL1 may be disposed on the first pixel electrode AE1 in the first emission area EA1, the second light emitting layer EL2 may be disposed on the second pixel electrode AE2 in the second emission area EA2, and the third light emitting layer EL3 may be disposed on the third pixel electrode AE3 in the third emission area EA3. The first to third light emitting layers EL1, EL2, and EL3 may be light emitting layers of the first to third light emitting elements ED1, ED2 and ED3, respectively. The first light emitting layer EL1 may be a light emitting layer emitting the red light, which is the light of the first color, the second light emitting layer EL2 may be a light emitting layer emitting the green light, which is the light of the second color, and the third light emitting layer EL3 may be a light emitting layer emitting the blue light, which is the light of the third color.

According to an embodiment, portions of the light emitting layers EL1, EL2, and EL3 of the light emitting elements ED1, ED2, and ED3 may be disposed between the pixel electrodes AE1, AE2, and AE3 and the inorganic insulating layer ISL. The inorganic insulating layer ISL may be disposed on the pixel electrodes AE1, AE2, and AE3, but may be spaced apart from the upper surfaces of the pixel electrodes AE1, AE2, and AE3. The deposition process of the light emitting layers EL1, EL2, and EL3 may be performed so that materials of the light emitting layers are deposited in a direction inclined with respect to an upper surface of the substrate SUB rather than a direction perpendicular to the upper surface of the substrate SUB. Accordingly, the light emitting layers EL1, EL2, and EL3 may be disposed on the upper surfaces of the pixel electrodes AE1, AE2, and AE3 exposed in the openings OPE1, OPE2, and OPE3 of the bank structure BNS, and may fill spaces between the pixel electrodes AE1, AE2, and AE3 and the inorganic insulating layer ISL.

In the manufacturing processes of the display device 10, a sacrificial layer SFL (see FIG. 8) may be disposed between the inorganic insulating layer ISL and the pixel electrodes AE1, AE2, and AE3, and the light emitting layers EL1, EL2, and EL3 may then be disposed in areas in which the sacrificial layer SFL is partially removed. Accordingly, a lower surface of the inorganic insulating layer ISL may be spaced apart from the pixel electrodes AE1, AE2, and AE3. However, the sacrificial layer SFL may remain as partial residual patterns RP in areas between the inorganic insulating layer ISL and the pixel electrodes AE1, AE2, and AE3. The areas between the inorganic insulating layer ISL and the pixel electrodes AE1, AE2, and AE3 may be filled with the partial residual patterns RP and the light emitting layers EL1, EL2, and EL3.

The display device 10, according to an embodiment, may include a plurality of organic patterns ELP1, ELP2, and ELP3 including the same materials as the light emitting layers EL1, EL2, and EL3, respectively, and disposed on the bank structure BNS. Since the light emitting layers EL1, EL2, and EL3 are formed through a process of depositing materials on the entire surface of the display device 10, materials forming the light emitting layers EL1, EL2, and EL3 may be deposited on the bank structure BNS as well as in the openings OPE1, OPE2, and OPE3 of the bank structure BNS.

For example, the display device 10 may include the organic patterns ELP1, ELP2, and ELP3 disposed on the bank structure BNS. The organic patterns ELP1, ELP2, and ELP3 may include a first organic pattern ELP1, a second organic pattern ELP2, and a third organic pattern ELP3 disposed on the second bank layer BN2 of the bank structure BNS.

The first organic pattern ELP1 may include a same material as the first light emitting layer EL1 of the first light emitting element ED1. The second organic pattern ELP2 may include a same material as the second light emitting layer EL2 of the second light emitting element ED2, and the third organic pattern ELP3 may include a same material as the third light emitting layer EL3 of the third light emitting element ED3. The organic patterns ELP1, ELP2, and ELP3 may be formed in the same processes as the light emitting layers EL1, EL2, and EL3 including the same materials as the organic patterns ELP1, ELP2, and ELP3, respectively.

The first organic pattern ELP1, the second organic pattern ELP2, and the third organic pattern ELP3 may be disposed directly on the second bank layer BN2 of the bank structure BNS. The organic patterns ELP1, ELP2, and ELP3 may be formed in the same processes as the light emitting layers EL1, EL2, and EL3 including the same materials as the organic patterns ELP1, ELP2, and ELP3, respectively, and may be disposed adjacent to the emission areas EA1, EA2, and EA3 in which the respective light emitting layers EL1, EL2, and EL3 are disposed. For example, the first organic pattern ELP1 may be disposed on the second bank layer BN2 while at least partially surrounding the first opening OPE1 around the first emission area EA1 or the first opening OPE1. The second organic pattern ELP2 may be disposed on the second bank layer BN2 while at least partially surrounding the second opening OPE2 around the second emission area EA2 or the second opening OPE2, and the third organic pattern ELP3 may be disposed on the second bank layer BN2 while at least partially surrounding the third opening OPE3 around the third emission area EA3 or the third opening OPE3.

Such organic patterns ELP1, ELP2, and ELP3 may be traces formed while the deposited materials are disconnected from the light emitting layers EL1, EL2, and EL3 rather than being connected to the light emitting layers EL1, EL2, and EL3 because the bank structure BNS includes the tips TIP. The light emitting layers EL1, EL2, and EL3 may be formed in the openings OPE1, OPE2, and OPE3, and the organic patterns ELP1, ELP2, and ELP3 and the light emitting layers EL1, EL2, and EL3 may be disconnected from each other by the tips TIP formed on the sidewalls of the openings OPE1, OPE2, and OPE3. The light emitting layers EL1, EL2, and EL3 are formed through the deposition process that does not use the mask, and accordingly, materials of the light emitting layers EL1, EL2, and EL3 may be entirely formed on the bank structure BNS, and the organic patterns ELP1, ELP2, and ELP3 may be formed by patterning these materials around the emission areas EA1, EA2, and EA3 or the openings OPE1, OPE2, and OPE3.

The common electrodes CE1, CE2, and CE3 may be disposed on the light emitting layers EL1, EL2, and EL3. The common electrodes CE1, CE2, and CE3 may include a transparent conductive material emitting light generated from the light emitting layers EL1, EL2, and EL3. The common electrodes CE1, CE2, and CE3 may receive a common voltage or a low potential voltage. When the pixel electrodes AE1, AE2, and AE3 receive a voltage corresponding to a data voltage and the common electrodes CE1, CE2, and CE3 receive the low potential voltage, potential differences are formed between the pixel electrodes AE1, AE2, and AE3 and the common electrodes CE1, CE2, and CE3, such that the light emitting layers EL1, EL2, and EL3 may emit light.

The common electrodes CE1, CE2, and CE3 may include a first common electrode CE1, a second common electrode CE2, and a third common electrode CE3 disposed in the different emission areas EA1, EA2, and EA3. The first common electrode CE1 may be disposed on the first light emitting layer EL1 in the first emission area EA1, the second common electrode CE2 may be disposed on the second light emitting layer EL2 in the second emission area EA2, and the third common electrode CE3 may be disposed on the third light emitting layer EL3 in the third emission area EA3.

According to an embodiment, portions of the common electrodes CE1, CE2, and CE3 of the light emitting elements ED1, ED2, and ED3 may be disposed on side surfaces of the first bank layer BN1 of the bank structure BNS. Similar to the light emitting layers EL1, EL2, and EL3, the common electrodes CE1, CE2, and CE3 may also be formed through a deposition process. The deposition process of the common electrodes CE1, CE2, and CE3 may be performed so that electrode materials are deposited in a direction inclined with respect to the upper surface of the substrate SUB rather than the direction perpendicular to the upper surface of the substrate SUB. Accordingly, the common electrodes CE1, CE2, and CE3 may be disposed on the side surfaces of the first bank layer BN1 under the tips TIP of the second bank layer BN2 of the bank structure BNS. The common electrodes CE1, CE2, and CE3 may be in direct contact with the side surfaces of the first bank layer BN1. The common electrodes CE1, CE2, and CE3 of the different light emitting elements ED1, ED2, and ED3 may be in direct contact with the first bank layer BN1 of the bank structure BNS, respectively, and the common electrodes CE1, CE2, and CE3 may be electrically connected to each other. Unlike the pixel electrodes AE1, AE2, and AE3, the common electrodes CE1, CE2, and CE3 are not divided for each of a plurality of pixels, and may be implemented in an electrode form that is electrically common to all pixels.

According to an embodiment, a contact area between the common electrodes CE1, CE2, and CE3 and the side surfaces of the first bank layer BN1 may be greater in size than a contact area between the light emitting layers EL1, EL2, and EL3 and the side surfaces of the first bank layer BN1. Each of the deposition processes of the common electrodes CE1, CE2, and CE3 and the light emitting layers EL1, EL2, and EL3 may be performed so that the materials of the common electrodes CE1, CE2, and CE3 and the light emitting layers EL1, EL2, and EL3 are deposited in the direction inclined with respect to the upper surface of the substrate SUB rather than the direction perpendicular to the upper surface of the substrate SUB, and areas of the common electrodes CE1, CE2, and CE3 and the light emitting layers EL1, EL2, and EL3 disposed on the side surfaces of the first bank layer BN1 may change depending on an inclined angle. In an embodiment, the deposition process of the common electrodes CE1, CE2, and CE3 may be performed in a more inclined direction than the deposition process of the light emitting layers EL1, EL2, and EL3. The common electrodes CE1, CE2, and CE3 may have a greater area than the light emitting layers EL1, EL2, and EL3 on the sidewalls of the openings OPE1, OPE2, and OPE3 or may be disposed up to a greater height on the sidewalls of the openings OPE1, OPE2, and OPE3 than the light emitting layers EL1, EL2, and EL3. Since the common electrodes CE1, CE2, and CE3 of the different light emitting elements ED1, ED2, and ED3 are electrically connected to each other through the first bank layer BN1, the common electrodes CE1, CE2, and CE3 are in contact with the first bank layer BN1 in a greater area.

The display device 10, according to an embodiment, may include a plurality of electrode patterns CEP1, CEP2, and CEP3 including the same materials as the common electrodes CE1, CE2, and CE3 and disposed on the bank structure BNS. Since the common electrodes CE1, CE2, and CE3 are formed through a process of depositing materials on the entire surface of the display device 10, materials forming the common electrodes CE1, CE2, and CE3 may be deposited on the bank structure BNS as well as in the openings OPE1, OPE2, and OPE3 of the bank structure BNS.

The display device 10 may include electrode patterns CEP1, CEP2, and CEP3 disposed on the bank structure BNS. The electrode patterns CEP1, CEP2, and CEP3 may include a first electrode pattern CEP1, a second electrode pattern CEP2, and a third electrode pattern CEP3 disposed on the second bank layer BN2 of the bank structure BNS.

For example, the first electrode pattern CEP1, the second electrode pattern CEP2, and the third electrode pattern CEP3 may be disposed directly on the first organic pattern ELP1, the second organic pattern ELP2, and the third organic pattern ELP3, respectively. An arrangement relationship between the electrode patterns CEP1, CEP2, and CEP3 and the organic patterns ELP1, ELP2, and ELP3 may be the same as an arrangement relationship between the light emitting layers EL1, EL2, and EL3 and the common electrodes CE1, CE2, and CE3 of the light emitting elements ED1, ED2, and ED3. Such electrode patterns CEP1, CEP2, and CEP3 may be traces formed while the deposited materials are disconnected from the common electrodes CE1, CE2, and CE3 rather than being connected to the common electrodes CE1, CE2, and CE3 because the bank structure BNS includes the tips TIP. In the display device 10, the common electrodes CE1, CE2, and CE3 may be individually formed in different areas even in the deposition process that does not use the mask by the tips TIP of the bank structure BNS.

Capping layers CPL may be disposed on the common electrodes CE1, CE2, and CE3. The capping layers CPL may include an inorganic insulating material and may at least partially cover the light emitting elements ED1, ED2, and ED3 and the patterns disposed on the bank structure BNS. The capping layers CPL may prevent damage to the light emitting elements ED1, ED2, and ED3 from ambient air and may prevent the patterns disposed on the bank structure BNS from being peeled off during the manufacturing processes of the display device 10. In an embodiment, the capping layer CPL may include aluminum oxide, titanium oxide, tantalum oxide, hafnium oxide, zinc oxide, silicon oxide, silicon nitride, and/or silicon oxynitride.

The display device 10 may include capping patterns CLP disposed above the bank structure BNS. The capping patterns CLP may be disposed directly on the first electrode pattern CEP1, the second electrode pattern CEP2, and the third electrode pattern CEP3 disposed on the second bank layer BN2 of the bank structure BNS. An arrangement relationship between the capping patterns CLP and the electrode patterns CEP1, CEP2, and CEP3 may be the same as an arrangement relationship between the common electrodes CE1, CE2, and CE3 of the light emitting elements ED1, ED2, and ED3 and the capping layers CPL. Such capping patterns CLP may be traces formed while the deposited materials are disconnected from the capping layers CLP rather than being connected to the capping layers CLP because the bank structure BNS includes the tips TIP.

The plurality of organic patterns ELP1, ELP2, and ELP3, the electrode patterns CEP1, CEP2, and CEP3, and the capping patterns CLP may be disposed on the bank structure BNS, and may at least partially surround the emission areas EA1, EA2, and EA3 or the openings OPE1, OPE2, and OPE3. A stacked structure of the organic patterns ELP1, ELP2, and ELP3, the electrode patterns CEP1, CEP2, and CEP3, and the capping patterns CLP disposed around the emission areas EA1, EA2, and EA3 may be partially etched in the manufacturing processes of the display device 10, such that a pattern shape may be changed. Accordingly, portions of an upper surface of the second bank layer BN2 of the bank structure BNS might not be covered by the organic patterns ELP1, ELP2, and ELP3, the electrode patterns CEP1, CEP2, and CEP3, and the capping patterns CLP.

The thin film encapsulation layer TFEL may be disposed on the light emitting elements ED1, ED2, and ED3. The thin film encapsulation layer TFEL may include at least one inorganic film to prevent oxygen or moisture from permeating into the light emitting element layer EML.

In an embodiment, the thin film encapsulation layer TFEL may include a first encapsulation layer TFE1 disposed on the light emitting elements ED1, ED2, and ED3 and the bank structure BNS and a second encapsulation layer TFE2 disposed on a light blocking layer BM and color filters CF1, CF2, and CF3. The first encapsulation layer TFE1 and the second encapsulation layer TFE2 may be inorganic encapsulation layers.

The first encapsulation layer TFE1 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The first encapsulation layer TFE1 may be disposed on the light emitting elements ED1, ED2, and ED3, a plurality of patterns, and the bank structure BNS. The first encapsulation layer TFE1 may include the first inorganic layer TL1, the second inorganic layer TL2, and the third inorganic layer TL3 corresponding respectively to the different emission areas EA1, EA2, and EA3.

The first inorganic layer TL1, the second inorganic layer TL2, and the third inorganic layer TL3 may include an inorganic insulating material and may at least partially cover the light emitting elements ED1, ED2, and ED3, respectively. The first inorganic layer TL1, the second inorganic layer TL2, and the third inorganic layer TL3 may prevent damage to the light emitting elements ED1, ED2, and ED3 from ambient air and prevent the patterns disposed on the bank structure BNS from being peeled off during the manufacturing processes of the display device 10. In an embodiment, the first inorganic layer TL1, the second inorganic layer TL2, and the third inorganic layer TL3 may include aluminum oxide, titanium oxide, tantalum oxide, hafnium oxide, zinc oxide, silicon oxide, silicon nitride, and/or silicon oxynitride.

The first inorganic layer TL1, the second inorganic layer TL2, and the third inorganic layer TL3 may at least partially cover the organic patterns ELP1, ELP2, and ELP3, the electrode patterns CEP1, CEP2, and CEP3, and the capping patterns CLP. The first inorganic layer TL1, the second inorganic layer TL2, and the third inorganic layer TL3 may be formed through chemical vapor deposition (CVD), and may thus be formed at a uniform thickness along steps of layers on which they are deposited. For example, the first inorganic layer TL1, the second inorganic layer TL2, and the third inorganic layer TL3 may form thin films even under the undercuts by the tips TIP of the bank structure BNS.

The first inorganic layer TL1 may be disposed on the first light emitting element ED1 and the first electrode pattern CEP1. The first inorganic layer TL1 may be disposed along the first light emitting element ED1 and the inner sidewall of the first opening OPE1 so as to at least partially cover the first light emitting element ED1 and the inner sidewall of the first opening OPE1, and may also at least partially cover the first organic pattern ELP1, the first electrode pattern CEP1, and the capping pattern CLP. However, the first inorganic layer TL1 might not overlap the second opening OPE2 and the third opening OPE3, and may be disposed just in the first opening OPE1 and on the bank structure BNS around the first opening OPE1.

The second inorganic layer TL2 may be disposed on the second light emitting element ED2 and the second electrode pattern CEP2. The second inorganic layer TL2 may be disposed along the second light emitting element ED2 and the inner sidewall of the second opening OPE2 so as to at least partially cover the second light emitting element ED2 and the inner sidewall of the second opening OPE2, and may also at least partially cover the second organic pattern ELP2, the second electrode pattern CEP2, and the capping pattern CLP. However, the second inorganic layer TL2 might not overlap the first opening OPE1 and the third opening OPE3, and may be disposed just in the second opening OPE2 and on the bank structure BNS around the second opening OPE2.

The third inorganic layer TL3 may be disposed on the third light emitting element ED3 and the third electrode pattern CEP3. The third inorganic layer TL3 may be disposed along the third light emitting element ED3 and the inner sidewall of the third opening OPE3 so as to at least partially cover the third light emitting element ED3 and the inner sidewall of the third opening OPE3, and may also at least partially cover the third organic pattern ELP3, the third electrode pattern CEP3, and the capping pattern CLP. However, the third inorganic layer TL3 might not overlap the first opening OPE1 and the second opening OPE2, and may be disposed just in the third opening OPE3 and on the bank structure BNS around the third opening OPE3.

The first inorganic layer TL1 may be formed after the first common electrode CE1 is formed, the second inorganic layer TL2 may be formed after the second common electrode CE2 is formed, and the third inorganic layer TL3 may be formed after the third common electrode CE3 is formed. Accordingly, the first to third inorganic layers TL1, TL2, and TL3 may at least partially cover different electrode patterns CEP1, CEP2, and CEP3 and organic patterns ELP1, ELP2, and ELP3, respectively. Each of the first inorganic layer TL1, the second inorganic layer TL2, and the third inorganic layer TL3 may have a greater area than each of the openings OPE1, OPE2, and OPE3 of the bank structure BNS in a plan view. The first inorganic layer TL1, the second inorganic layer TL2, and the third inorganic layer TL3 may be spaced apart from each other on the bank structure BNS. Accordingly, portions of the second bank layer BN2 of the bank structure BNS might not overlap the inorganic layers TL1, TL2, and TL3, and portions of the upper surface of the second bank layer BN2 of the bank structure BNS may be exposed without being covered by the inorganic layers TL1, TL2, and TL3.

The light blocking layer BM may be disposed on the bank structure BNS. The light blocking layer BM may be disposed on portions of the bank structure BNS on which the plurality of patterns such as the organic patterns ELP1, ELP2, and ELP3, the electrode patterns CEP1, CEP2, and CEP3, and the capping patterns CLP are not disposed. As described above, the organic patterns ELP1, ELP2, and ELP3, the electrode patterns CEP1, CEP2, and CEP3, and the capping patterns CLP may be disposed on the bank structure BNS so as to at least partially surround the openings OPE1, OPE2, and OPE3, and trench parts TP may be formed between different patterns. The light blocking layer BM may be disposed in the trench parts TP formed by the plurality of patterns, and may partially overlap the patterns. For example, portions of the light blocking layer BM may be disposed on the first to third organic patterns ELP1, ELP2 and ELP3, the first to third electrode patterns CEP1, CEP2, and CEP3, and the capping patterns CLP. The first to third inorganic layers TL1, TL2, and TL3 of the first encapsulation layer TFE1 at least partially cover the organic patterns ELP1, ELP2, and ELP3, the electrode patterns CEP1, CEP2, and CEP3, and the capping patterns CLP, and thus, the light blocking layer BM may be disposed directly on the first to third inorganic layers TL1, TL2, and TL3.

The light blocking layer BM may include the plurality of opening holes OPT1, OPT2, and OPT3 at least partially overlapping the emission areas EA1, EA2, and EA3. For example, the first opening hole OPT1 may at least partially overlap the first emission area EA1. The second opening hole OPT2 may at least partially overlap the second emission area EA2, and the third opening hole OPT3 may at least partially overlap the third emission area EA3. An area or a size of each of the opening holes OPT1, OPT2, and OPT3 may be greater in size than the area or the size of each of the emission areas EA1, EA2, and EA3 defined by the bank structure BNS. The opening holes OPT1, OPT2, and OPT3 of the light blocking layer BM are formed to be greater than the emission areas EA1, EA2, and EA3, and accordingly, the light emitted from the emission areas EA1, EA2, and EA3 may be viewed by a user not only from a front surface but also from side surfaces of the display device 10.

The light blocking layer BM may include a light absorbing material. For example, the light blocking layer BM may include an inorganic black pigment or an organic black pigment. The inorganic black pigment may be carbon black, and the organic black pigment may include lactam black, perylene black, and/or aniline black, but the disclosure is not necessarily limited thereto. The light blocking layer BM may prevent color mixing due to permeation of visible light between the first to third emission areas EA1, EA2, and EA3 to increase a color gamut of the display device 10.

The display device 10 may include a plurality of color filters CF1, CF2, and CF3 disposed in the opening holes OPT1, OPT2, and OPT3 of the light blocking layer BM. The plurality of color filters CF1, CF2, and CF3 may correspond to the emission areas EA1, EA2, and EA3, respectively. The color filters CF1, CF2, and CF3 may be disposed on the light emitting elements ED1, ED2, and ED3, and the first encapsulation layer TFE1 while filling the openings OPE1, OPE2, and OPE3 of the bank structure BNS, respectively. For example, the color filters CF1, CF2, and CF3 may include a first color filter CF1, a second color filter CF2, and a third color filter CF3 corresponding to the different emission areas EA1, EA2, and EA3, respectively. The color filters CF1, CF2, and CF3 may include colorants such as dyes or pigments absorbing light of wavelength bands other than light of a specific wavelength band, and may correspond to the colors of the light emitting from the emission areas EA1, EA2, and EA3. For example, the first color filter CF1 may be a red color filter at least partially overlapping the first emission area EA1 and transmitting just the first light, which is the red light, therethrough. The second color filter CF2 may be a green color filter at least partially overlapping the second emission area EA2 and transmitting just the second light, which is the green light, therethrough, and the third color filter CF3 may be a blue color filter at least partially overlapping the third emission area EA3 and transmitting just the third light, which is the blue light, therethrough.

In addition, the color filters CF1, CF2, and CF3 may correspond to the plurality of opening holes OPT1, OPT2, and OPT3 of the light blocking layer BM, respectively. The color filters CF1, CF2, and CF3 may fill the opening holes OPT1, OPT2, and OPT3 of the light blocking layer BM, and may completely cover the light emitting areas formed by the opening holes OPT1, OPT2, and OPT3 of the light blocking layer BM. Portions of each of the color filters CF1, CF2, and CF3 may be disposed above the bank structure BNS and on each of the organic patterns ELP1, ELP2, and ELP3 and the electrode patterns CEP1, CEP2, and CEP3. The first to third inorganic layers TL1, TL2, and TL3 of the first encapsulation layer TFE1 at least partially cover the light emitting elements ED1, ED2, and ED3, the organic patterns ELP1, ELP2, and ELP3, the electrode patterns CEP1, CEP2, and CEP3, and the capping patterns CLP, and thus, the color filters CF1, CF2, and CF3 may be disposed directly on the first to third inorganic layers TL1, TL2, and TL3.

For example, the first color filter CF1 may fill the first opening OPE1 and the first opening hole OPT1, and a portion of the first color filter CF1 may be disposed on the first inorganic layer TL1. The second color filter CF2 may fill the second opening OPE2 and the second opening hole OPT2, and a portion of the second color filter CF2 may be disposed on the second inorganic layer TL2. The third color filter CF3 may fill the third opening OPE3 and the third opening hole OPT3, and a portion of the third color filter CF3 may be disposed on the third inorganic layer TL3. The color filters CF1, CF2, and CF3 may be directly formed in spaces formed by the bank structure BNS and the light blocking layer BM.

It has been illustrated in the drawing that the plurality of color filters CF1, CF2, and CF3 fill the opening holes OPT1, OPT2, and OPT3 of the light blocking layer BM, respectively, and are spaced apart from each other. However, the disclosure is not necessarily limited thereto. In some embodiments, the plurality of color filters CF1, CF2, and CF3 may be spaced apart from each other on the light blocking layer BM or may at least partially overlap each other on the light blocking layer BM. This will be described with reference to other embodiments.

The second encapsulation layer TFE2 may be disposed on the light blocking layer BM and the color filters CF1, CF2, and CF3. Similar to the first encapsulation layer TFE1, the second encapsulation layer TFE2 may include at least one inorganic film to prevent oxygen or moisture from permeating into the light emitting element layer EML, and may protect the light emitting layer EML from foreign substances such as dust. In an embodiment, the second encapsulation layer TFE2 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

An overcoat layer at least partially covering all of the lower layers may be further disposed on the second encapsulation layer TFE2. The overcoat layer may be a colorless light transmitting layer that does not have a color of a visible light band, and may protect a plurality of layers of the display device 10 from external impact. For example, the overcoat layer may include a colorless light transmitting organic material such as an acrylic resin.

The display device 10, according to an embodiment, may include the color filters CF1, CF2, and CF3 disposed on the light emitting elements ED1, ED2, and ED3 to increase color purity of light emitted from the emission areas EA1, EA2, and EA3, and reduce reflected light by ambient light without a separate polarizing member. In addition, in the display device 10, the color filters CF1, CF2, and CF3 are disposed directly in the openings OPE1, OPE2, and OPE3 of the bank structure BNS forming the emission areas EA1, EA2, and EA3, and accordingly, a distance between the light emitting elements ED1, ED2, and ED3 and the color filters CF1, CF2, and CF3 may become small. Furthermore, a separate layer on which the color filters CF1, CF2, and CF3 are disposed is omitted in the display device 10, such that the number of manufacturing processes of the display device 10 may be reduced and a thickness of the display device 10 may be reduced.

Hereinafter, manufacturing processes of the display device 10 according to an embodiment will be described with reference to other drawings.

FIGS. 8 to 17 are cross-sectional views sequentially illustrating manufacturing processes of the display device according to an embodiment. In FIGS. 8 to 17, processes of forming the bank structure BNS and the light emitting elements ED as the light emitting element layer EML of the display device 10, the color filters CF1, CF2, and CF3, and the thin film encapsulation layer TFEL are schematically illustrated. Hereinafter, a description of processes of forming respective layers among the manufacturing processes of the display device 10 will be omitted, and the order of forming the respective layers will be described.

Figure 8:
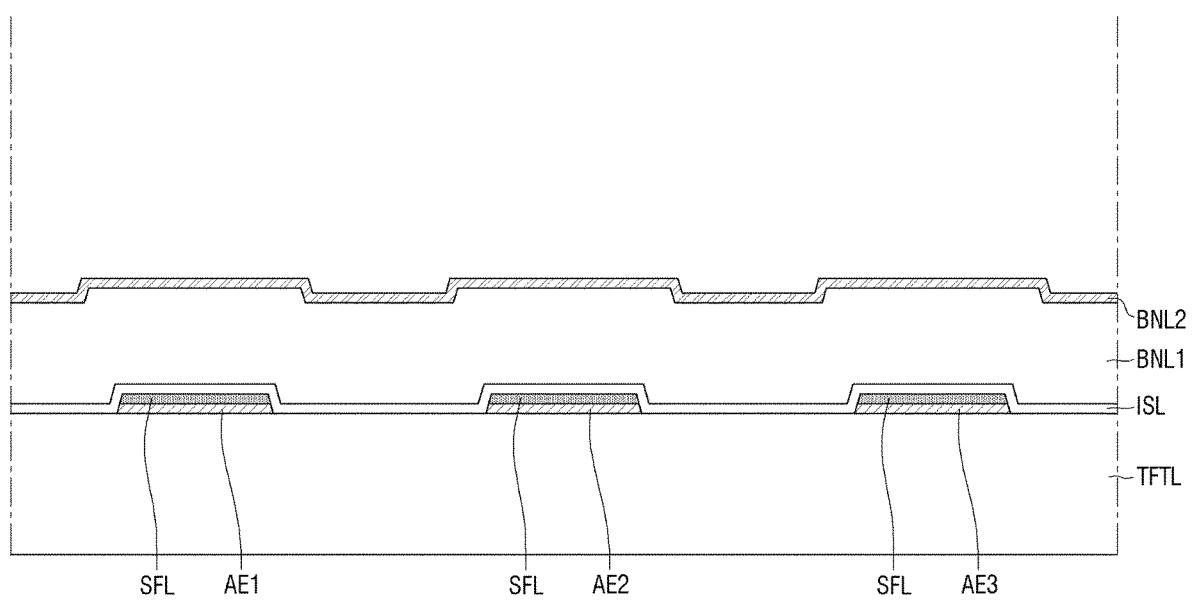
FIGS. 8 to 17 are cross-sectional views sequentially illustrating a manufacturing processes of the display device according to an embodiment.

Referring to FIG. 8, the plurality of pixel electrodes AE1, AE2, and AE3, the sacrificial layer SFL, the inorganic insulating layer ISL, and a plurality of bank material layers BNL1 and BNL2 are formed on the thin film transistor layer TFTL.

The thin film transistor layer TFTL may be disposed on the substrate SUB, and a structure of the thin film transistor TFTL is the same as that described above with reference to FIG. 6.

The plurality of pixel electrodes AE1, AE2, and AE3 may be spaced apart from each other on the thin film transistor layer TFTL. The pixel electrodes AE1, AE2, and AE3 may include a first pixel electrode AE1, a second pixel electrode AE2, and a third pixel electrode AE3 of different light emitting elements ED1, ED2, and ED3. The first to third pixel electrodes AE1, AE2, and AE3 may be spaced apart from each other on the thin film transistor layer TFTL.

The sacrificial layer SFL may be disposed on the pixel electrodes AE1, AE2, and AE3. The sacrificial layer SFL may be disposed on the pixel electrodes AE1, AE2, and AE3, and then partially removed in a subsequent process to form spaces in which the light emitting layers EL1, EL2, and EL3 are disposed. The sacrificial layer SFL may prevent the upper surfaces of the pixel electrodes AE1, AE2, and AE3 from being in contact with the inorganic insulating layer ISL, and may be removed to form spaces between the pixel electrodes AE1, AE2, and AE3 and the inorganic insulating layer ISL. In an embodiment, the sacrificial layer SFL may include an oxide semiconductor. For example, the sacrificial layer SFL may include indium gallium zinc oxide (IGZO), zinc tin oxide (ZTO), and/or indium tin oxide (IZO).

The inorganic insulating layer ISL and the bank material layers BNL1 and BNL2 may be disposed on the sacrificial layer SFL. The inorganic insulating layer ISL may entirely cover the sacrificial layer SFL and the thin film transistor layer TFTL, and the plurality of bank material layers BNL1 and BNL2 may entirely cover the inorganic insulating layer ISL. The bank material layers BNL1 and BNL2 may include a first bank material layer BNL1 and a second bank material layer BNL2 sequentially stacked. The first bank material layer BNL1 may be disposed directly on the inorganic insulating layer ISL, and the second bank material layer BNL2 may be disposed on the first bank material layer BNL1. The bank material layers BNL1 and BNL2 may be partially etched in a subsequent process to form the bank layers BN1 and BN2 of the bank structure BNS illustrated in FIG. 6, respectively. The first bank material layer BNL1 and the second bank material layer BNL2 may include different metal materials to form the first bank layer BN1 and the second bank layer BN2.

Figure 9:
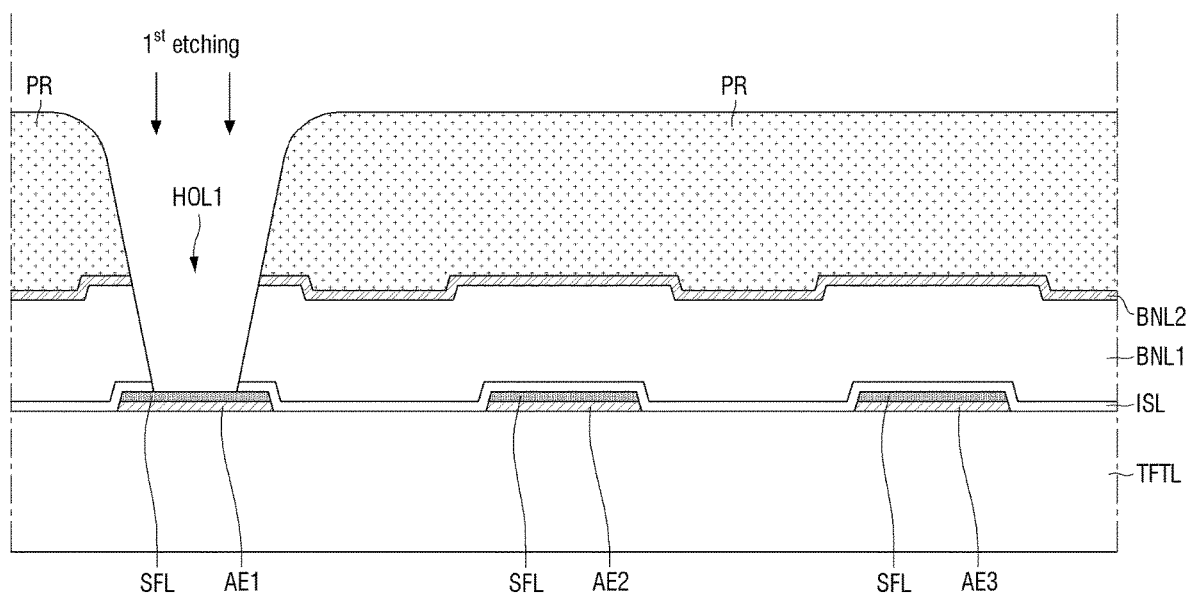

Next, referring to FIG. 9, a photoresist PR is formed on the bank material layers BNL1 and BNL2, and a first etching process ($1^{st}$ etching) of etching portions of the bank material layers BNL1 and BNL2 using the photoresist PR as a mask is performed to form a first hole HOL1.

The photoresists PR may be spaced apart from each other on the bank material layers BNL1 and BNL2. The photoresists PR may be disposed on the second bank material layer BNL2 so as not to overlap the first pixel electrode AE1 and so as to expose portions of the bank material layers BNL1 and BNL2 overlapping the first pixel electrode AE1.

In an embodiment, a dry etching process may be performed as the first etching process ($1^{st}$ etching). Since the dry etching process is performed as the first etching process ($1^{st}$ etching), the bank material layers BNL1 and BNL2 including different materials may be anisotropic ally etched. In the process, portions of the bank material layers BNL1 and BNL2 and the inorganic insulating layer ISL may be etched together to partially expose the sacrificial layer SFL disposed therebelow. The first hole HOL1 may be formed in an area at least partially overlapping the pixel electrode AE1, AE2, and AE3, and the first hole HOL1 may form the openings OPE1, OPE2, and OPE3 of the bank structure BNS.

Figure 10:
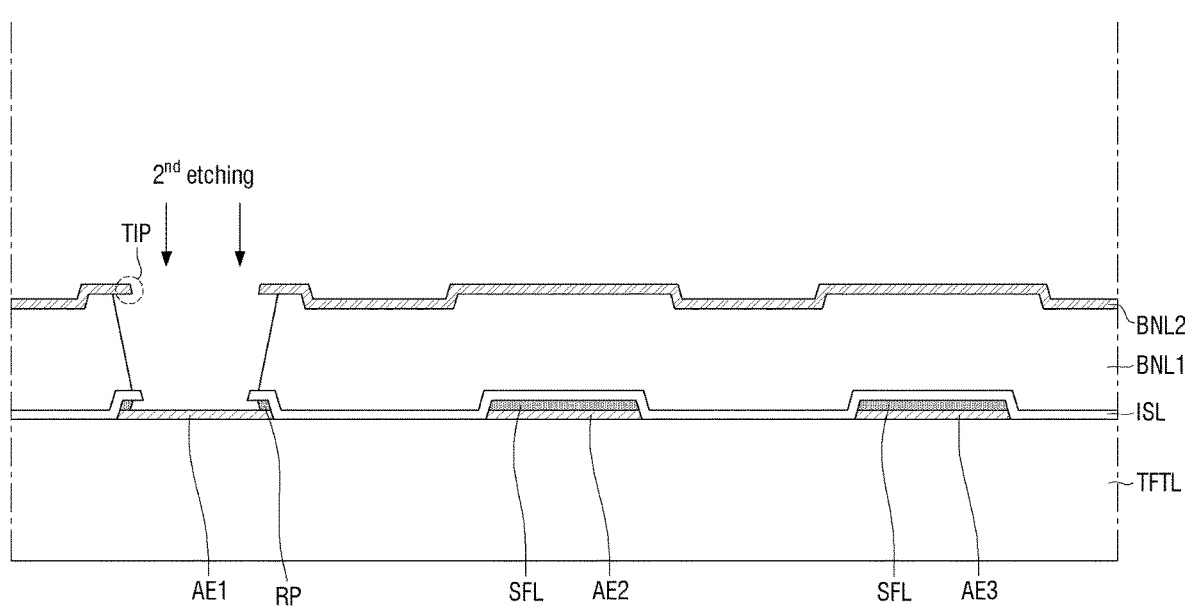

Next, referring to FIG. 10, a second etching process ($2^{nd}$ etching) of removing the sacrificial layer SFL disposed on the first pixel electrode AE1 is performed. In an embodiment, the sacrificial layer SFL may include an oxide semiconductor layer, and a wet etching process may be performed as the second etching process ($2^{nd}$ etching). In the process, an inner sidewall of the first hole HOL1 may be isotropically etched while the sacrificial layer SFL is removed. The first bank material layer BNL1 of the plurality of bank material layers BNL1 and BNL2 may have a faster etch rate than other bank material layers, and the second bank material layer BNL2 may have a tip TIP formed to protrude more than a side of the first bank material layer BNL1. The side of the first bank material layer BNL1 may have an undercut formed under the tip TIP of the second bank material layer BNL2. The first hole HOL1 may form the first opening OPE1 or the first emission area EA1 by the second etching process ($2^{nd}$ etching).

A portion of the sacrificial layer SFL exposed by the first hole HOL1 and a portion of the sacrificial layer SFL between the inorganic insulating layer ISL and the first pixel electrode AE1 may be removed. However, the sacrificial layer SFL might not be completely removed, and may remain as a partial residual pattern RP between the inorganic insulating layer ISL and the pixel electrode AE1. A space may be formed between the first pixel electrode AE1 and the inorganic insulating layer ISL disposed above the first pixel electrode AE1, as a portion after the sacrificial layer SFL is removed. In a subsequent process, the first light emitting layer EL1 disposed on the first pixel electrode AE1 may fill the space.

Figure 11:
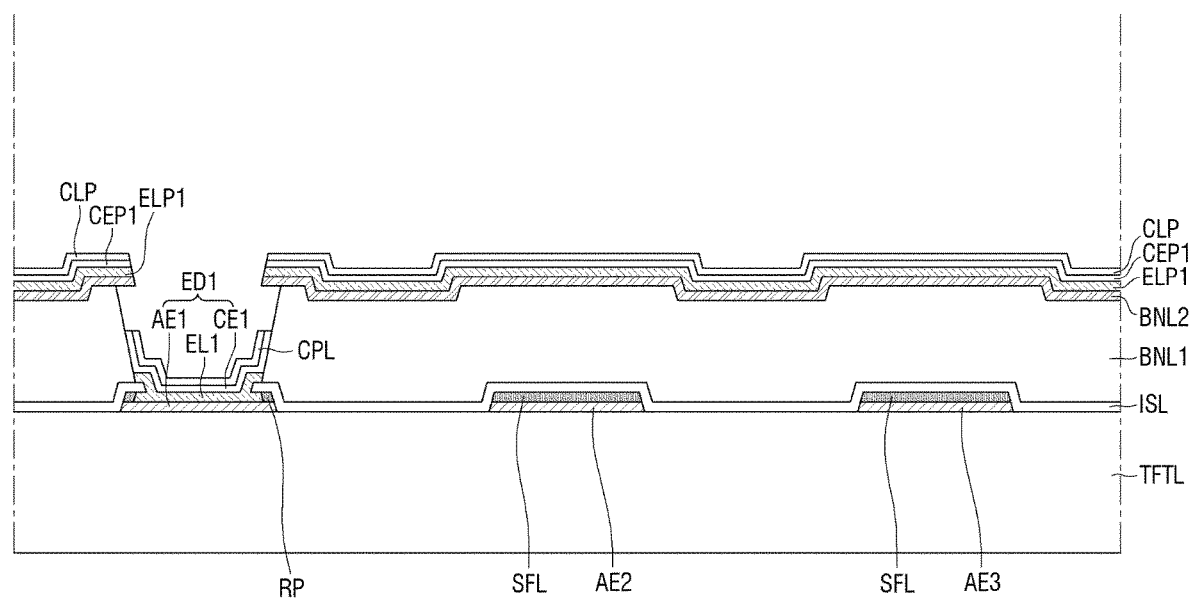

Next, referring to FIG. 11, the first light emitting element ED1 is formed by depositing the first light emitting layer EL1, the first common electrode CE1, and the capping layer CPL on the first pixel electrode AE1. The first light emitting layer EL1 and the first common electrode CE1 may be formed in the first opening OPE1, and materials forming the first light emitting layer EL1 and the first common electrode CE1 may also be deposited on the bank material layer BNL2 in the deposition process to form a plurality of patterns. For example, portions of such materials may be deposited on the second bank material layer BNL2 to form the first organic pattern ELP1 and the first electrode pattern CEP1 A portion of the capping layer CPL may be disposed in the first opening OPE1 to at least partially cover the first light emitting element ED1, and the other portion of the capping layer CPL may be disposed on the second bank material layer BNL2 to at least partially cover the first organic pattern ELP1 and the first electrode pattern CEP1. A description of structures of the first light emitting layer EL1, the first common electrode CE1, and the first organic pattern ELP1, and the first electrode pattern CEP1 is the same as that described above.

Meanwhile, the first light emitting layer EL1 and the first common electrode CE1 may be formed through deposition processes. Deposition of the materials might not be smooth in the first opening OPE1 due to the tip TIP of the second bank material layer BNL2. However, the materials of the first light emitting layer EL1 and the first common electrode CE1 are deposited in a direction inclined with the upper surface of the substrate rather than in the direction perpendicular to the upper surface of the substrate, and may thus be deposited in an area of the first bank material layer BNL1 hidden by the tip TIP.

For example, the deposition process of forming the first light emitting layer EL1 may be performed so that the materials are deposited in a direction that is not perpendicular to an upper surface of the first pixel electrode AE1, for example, in a direction inclined with respect to the upper surface of the first pixel electrodes AE1 at a first angle. In an embodiment, in a process of forming the light emitting layers EL1, EL2, and EL3, deposition of the materials may be performed at an inclined angle of 45° to 50° from the upper surface of the pixel electrodes AE1, AE2, and AE3. The first light emitting layer EL1 may fill the space between the first pixel electrode AE1 and the inorganic insulating layer ISL, and may also be formed in an area hidden by the tip TIP of the second bank material layer BNL2. For example, the first light emitting layer EL1 may be partially disposed on a side surface of the first bank material layer BNL1, which is the area hidden by the tip TIP.

The deposition process of forming the first common electrode CE1 may be performed so that the materials are deposited in a direction that is not perpendicular to the upper surface of the first pixel electrode AE1, for example, in a direction inclined with respect to the upper surface of the first pixel electrodes AE1 at a second angle. In an embodiment, in a process of forming the common electrodes CE1, CE2, and CE3, deposition of the materials may be performed at an inclined angle of 30° or less from the upper surface of the pixel electrodes AE1, AE2, and AE3. The first common electrode CE1 may be disposed on the first light emitting layer EL1, and may also be formed in the area hidden by the tip TIP of the second bank material layer BNL2. For example, the first common electrode CE1 may be partially disposed on the side surface of the first bank material layer BNL1, which is the area hidden by the tip TIP.

The deposition process of forming the common electrodes CE1, CE2, and CE3 may be performed in an inclined direction closer to a relatively horizontal direction than the deposition process of forming the light emitting layers EL1, EL2, and EL3. Accordingly, the common electrodes CE1, CE2, and CE3 may be in contact with side surfaces of the first bank material layer BNL1 or the first bank layer BN1 in a greater area than the light emitting layers EL1, EL2, and EL3. Alternatively, the common electrodes CE1, CE2, and CE3 may be deposited up to a higher position on the side surfaces of the first bank material layer BNL1 or the first bank layer BN1 than the light emitting layers EL1, EL2, and EL3. The different common electrodes CE1, CE2, and CE3 may be in contact with the first bank material layer BNL1 or the first bank layer BN1 having a high conductivity to be electrically connected to each other.

Figure 12:
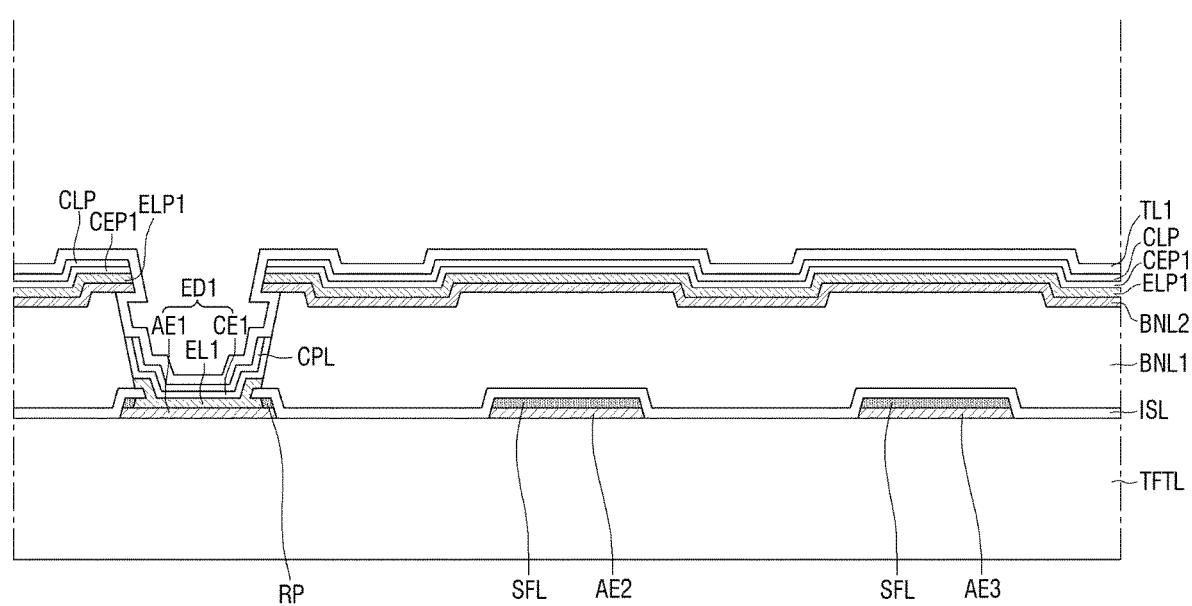

Next, referring to FIG. 12, the first inorganic layer TL1 at least partially covering the first light emitting element ED1 and the capping layer CPL is formed. The first inorganic layer TL1 may be formed by a chemical vapor deposition (CVD) process unlike the light emitting layers EL1, EL2, and EL3 and the common electrodes CE1, CE2, and CE3, and may form a uniform film regardless of a step of a portion on which the first organic layer TL1 is deposited. The first inorganic layer TL1 may completely cover outer surfaces of the first light emitting element ED1, the bank material layers BNL1 and BNL2, and the capping layer CPL. In particular, the first inorganic layer TL1 may also be deposited under the tip TIP of the second bank material layer BNL2.

Figure 13:
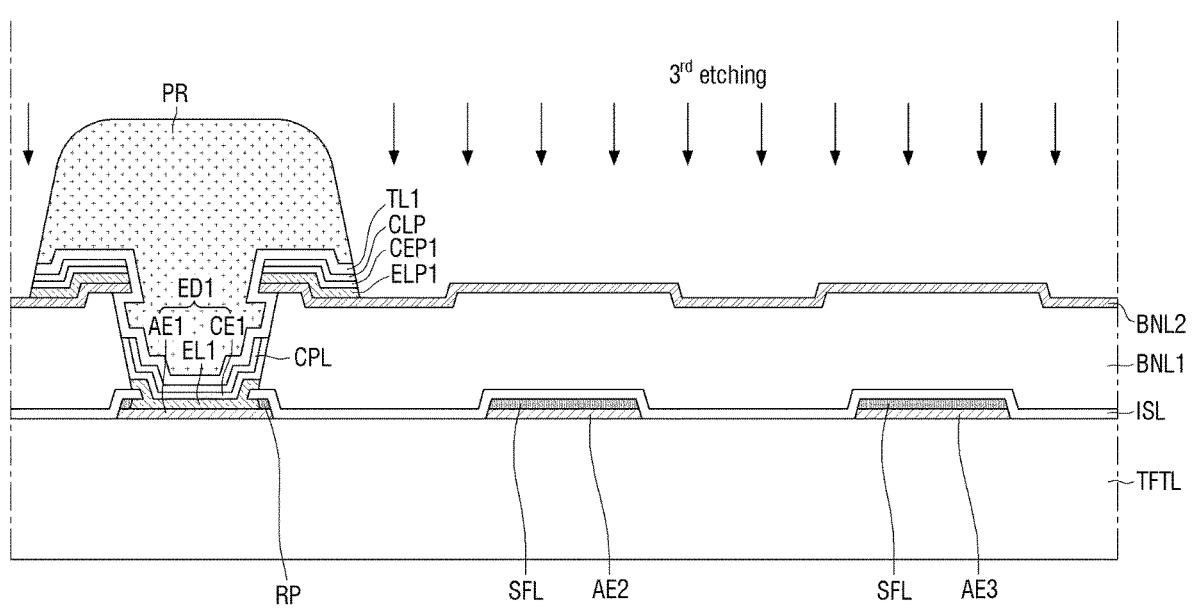

Next, referring to FIG. 13, a photoresist PR is formed on the first inorganic layer TL1, and a third etching process ($3^{rd}$ etching) of removing portions of the first organic pattern ELP1, the first electrode pattern CEP1, the capping layer CPL, and the first inorganic layer TL1 disposed on the bank material layers BNL1 and BNL2 is performed.

In the process, the photoresist PR may at least partially overlap the first opening OPE1 or the first light emitting element ED1. The first organic pattern ELP1, the first electrode pattern CEP1, the capping pattern CLP, and the first inorganic layer TL1 disposed on the bank material layers BNL1 and BNL2 may be entirely removed except for a portion around the first opening OPE1 or the first light emitting element ED1. In the process, an area of the second bank material layer BNL2 except for the portion around the first opening OPE1 or the first light emitting element ED1 may be exposed. In an embodiment, a dry etching process using a fluorine (F)-based etchant may be performed as the third etching process ($3^{rd}$ etching) of removing the first inorganic layer TL1 disposed on the bank material layers BNL1 and BNL2.

Figure 14:
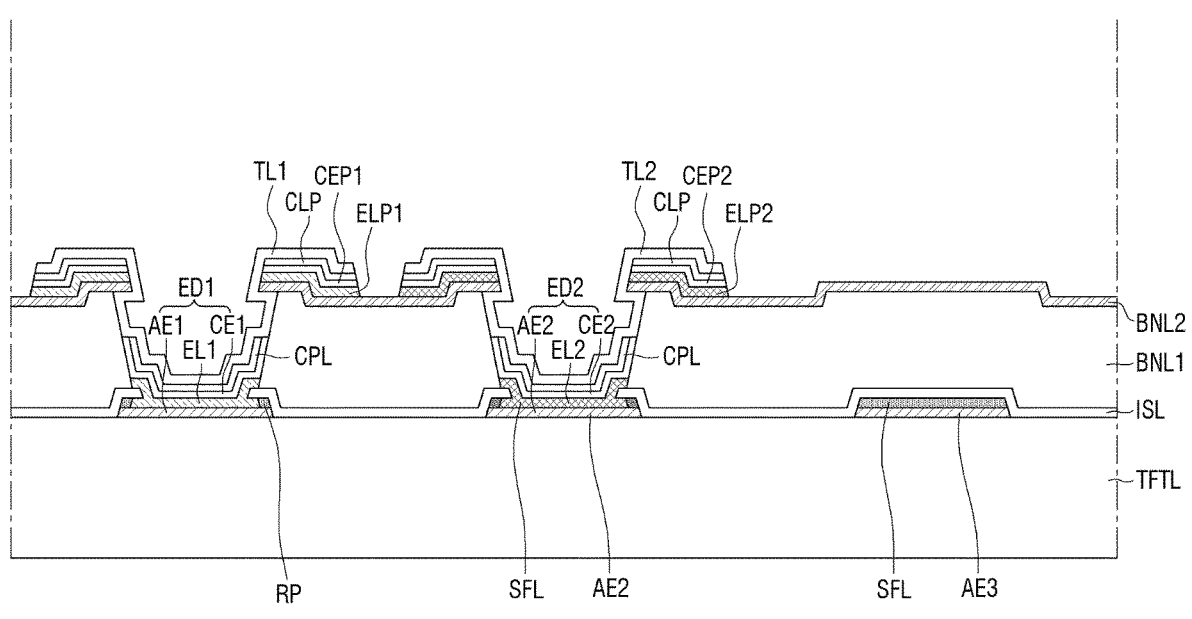
Figure 15:
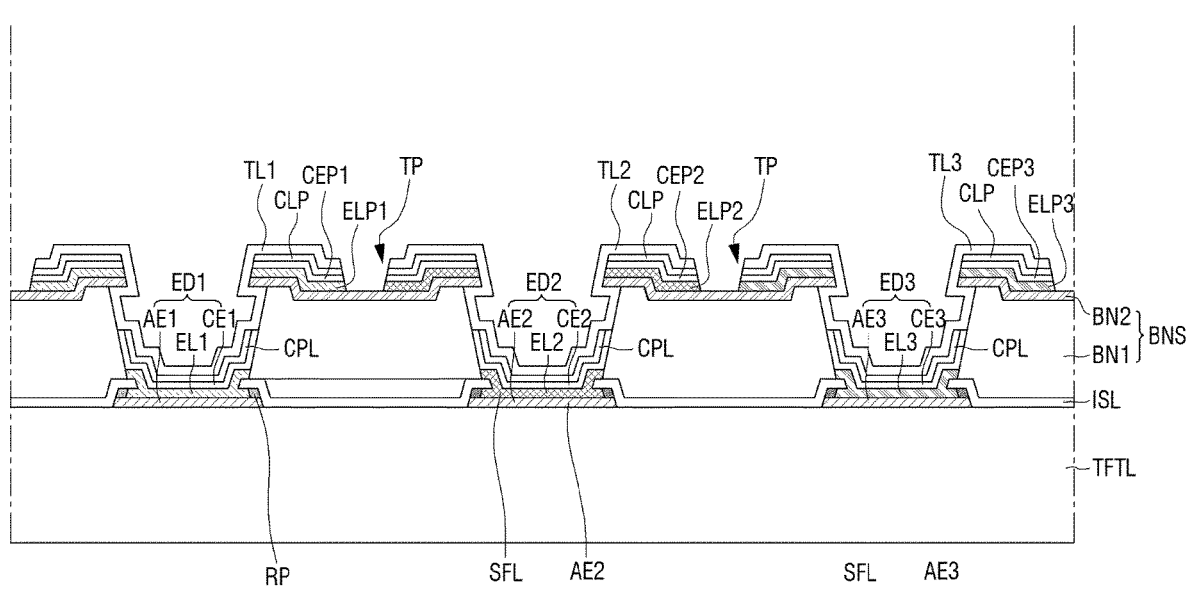

Through the above processes, the first light emitting element ED1 and the first inorganic layer TL1 at least partially covering the first light emitting element ED1, the first organic pattern ELP1, the first electrode pattern CEP1, and the capping layer CPL may be formed. Referring to FIGS. 14 and 15, the second light emitting element ED2, the third light emitting element ED3, the second and third organic patterns ELP2 and ELP3, the second and third electrode patterns CEP2 and CEP3, the second inorganic layer TL2, and the third inorganic layer TL3 may be formed by repeating processes similar to the processes described above.

Figure 16:
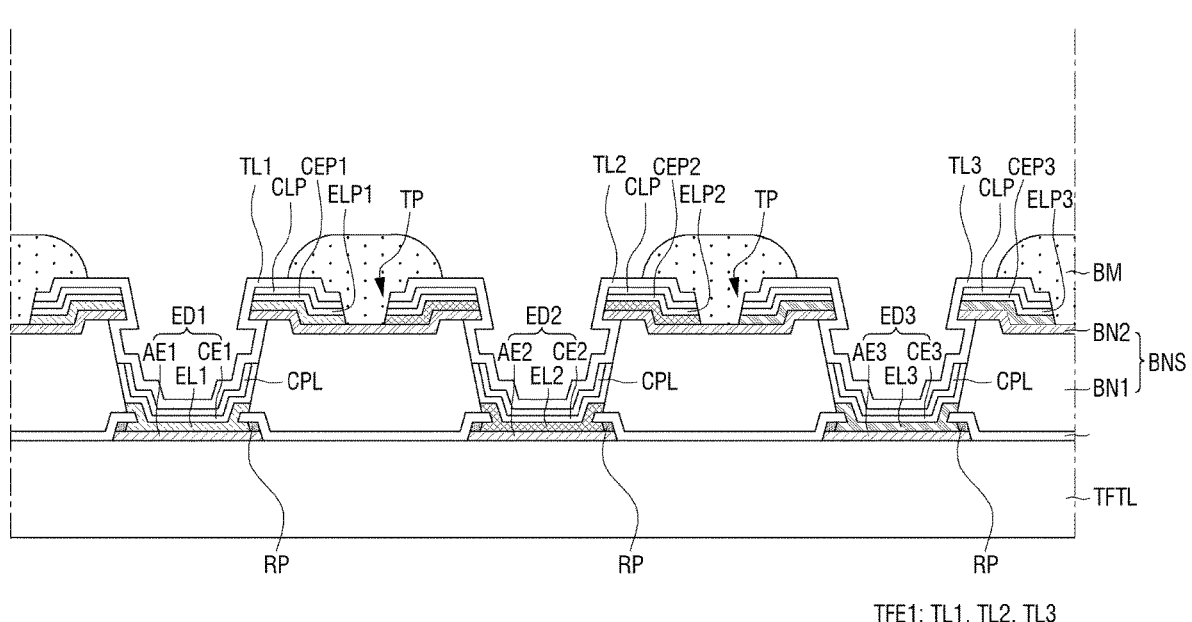
Figure 17:
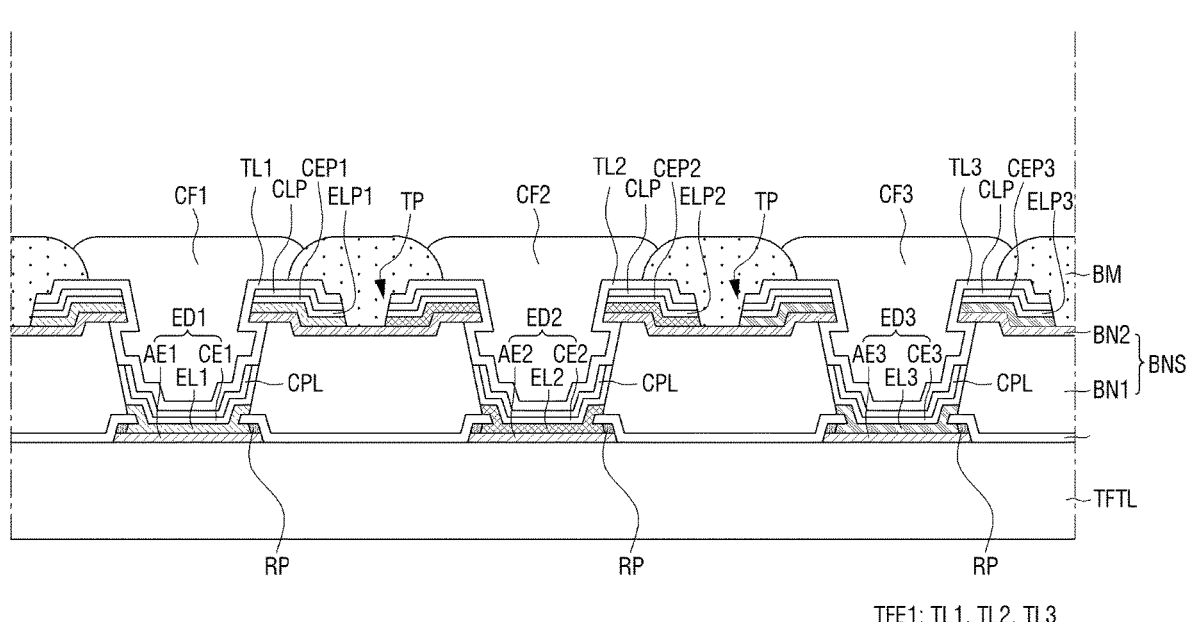

Next, referring to FIGS. 16 and 17, the light blocking layer BM is formed on the bank structure BNS, and the color filters CF1, CF2, and CF3 are formed in the openings OPE1, OPE2, and OPE3 of the bank structure BNS.

The plurality of organic patterns ELP1, ELP2, and ELP3, the electrode patterns CEP1, CEP2, and CEP3, and the capping patterns CLP may be disposed on the bank structure BNS, and the trench parts TP that are portions in which these patterns are spaced apart from each other may be formed. The upper surface of the second bank layer BN2 may be exposed in the trench parts TP, and the light blocking layer BM may be disposed in the trench parts TP. The light blocking layer BM may fill the trench parts TP, and portions of the light blocking layer BM may be disposed on the organic patterns ELP1, ELP2, and ELP3, the electrode patterns CEP1, CEP2, and CEP3, and the capping patterns CLP. Portions of a lower surface of the light blocking layer BM may be in contact with the second bank layer BN2, and the other portions of the lower surface of the light blocking layer BM may be in contact with the organic patterns ELP1, ELP2, and ELP3, the electrode patterns CEP1, CEP2, and CEP3, the capping patterns CLP, and the inorganic layers TL1, TL2, and TL3.

The plurality of color filters CF1, CF2, and CF3 may fill the openings OPE1, OPE2, and OPE3 formed by the bank structure BNS and the opening holes OPT1, OPT2, and OPT3 formed by the light blocking layer BM. The first color filter CF1 may fill the first opening OPE1 and the first opening hole OPT1, and a portion of the first color filter CF1 may be disposed on the first inorganic layer TL1. The second color filter CF2 may fill the second opening OPE2 and the second opening hole OPT2, and a portion of the second color filter CF2 may be disposed on the second inorganic layer TL2. The third color filter CF3 may fill the third opening OPE3 and the third opening hole OPT3, and a portion of the third color filter CF3 may be disposed on the third inorganic layer TL3. The color filters CF1, CF2, and CF3 may be directly formed in spaces formed by the bank structure BNS and the light blocking layer BM, and may become close the light emitting elements ED1, ED2, and ED3, such that optical characteristics of the display device 10 may be more desirable. In an embodiment, a patterning process or an inkjet printing process may be performed as a process of forming the color filters CF1, CF2, and CF3. The different color filters CF1, CF2, and CF3 may be formed through sequentially repeated processes or may be simultaneously formed through one process.

Next, the display device 10 is manufactured by forming the second encapsulation layer TFE2 on the color filters CF1, CF2, and CF3 and the light blocking layer BM. The second encapsulation layer TFE2 may be formed through a chemical vapor deposition (CVD) process, similar to a plurality of inorganic layers TL1, TL2, and TL3. A structure of the second encapsulation layer TFE2 is the same as that described above.

Hereinafter, various embodiments of the display device 10 will be described with reference to other drawings.

Figure 18:
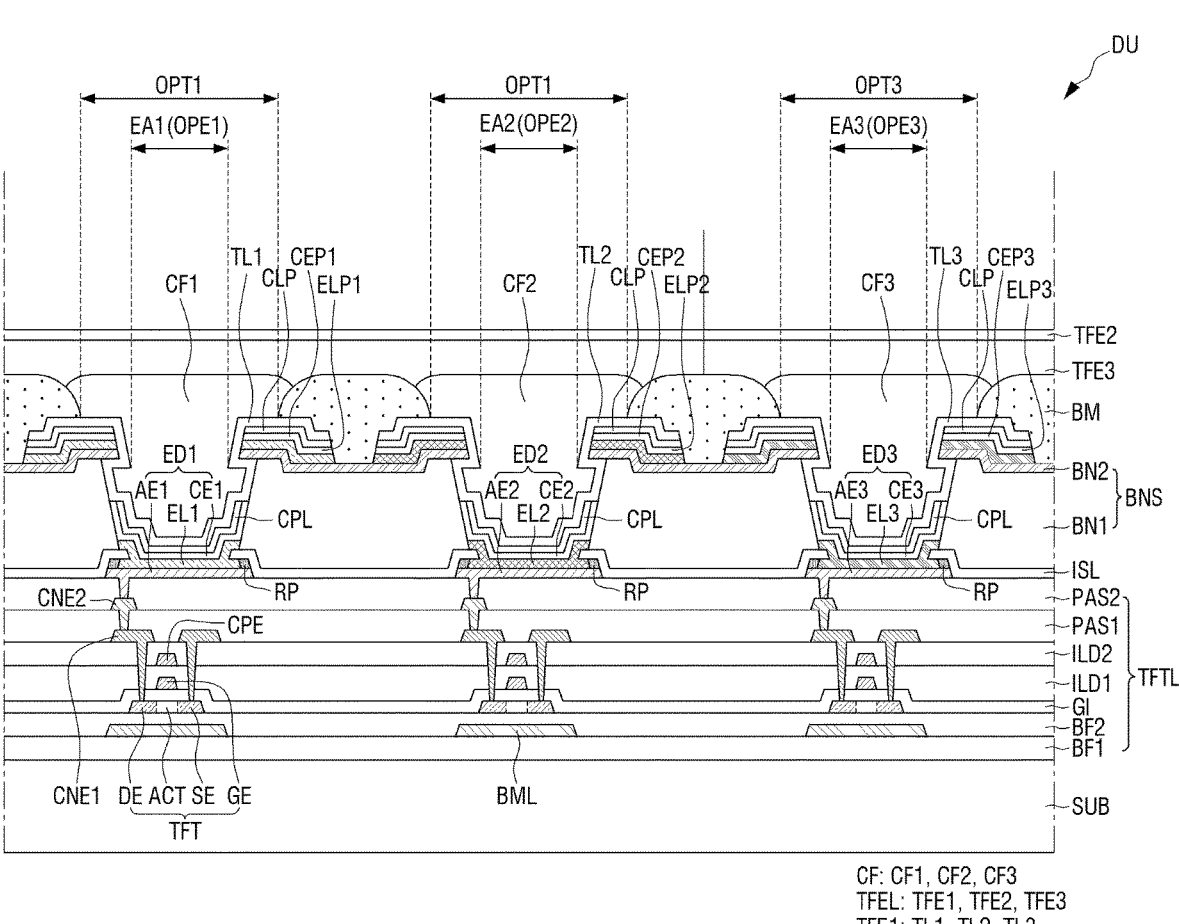
FIG. 18 is a cross-sectional view illustrating a portion of a display device according to an embodiment.

FIG. 18 is a cross-sectional view illustrating a portion of a display device according to an embodiment.

Referring to FIG. 18, in a display device 10, according to an embodiment, the thin film encapsulation layer TFEL may further include a third encapsulation layer TFE3 disposed between the second encapsulation layer TFE2 and the color filters CF1, CF2, and CF3. The third encapsulation layer TFE3 may be an organic encapsulation layer unlike the first encapsulation layer TFE1 and the second encapsulation layer TFE2. The thin film encapsulation layer TFEL may further include the third encapsulation layer TFE3 made of an organic material to planarize a step due to the color filters CF1, CF2, and CF3 and the light blocking layer BM and prevent the light emitting element layer EML from being damaged by dust or foreign substances.

In an embodiment, the third encapsulation layer TFE3 may include a polymer-based material. The polymer-based material may include an acrylic resin, an epoxy-based resin, polyimide, polyethylene, and the like. For example, the third encapsulation layer TFE3 may include an acrylic resin such as polymethyl methacrylate or polyacrylic acid. The third encapsulation layer TFE3 may be formed by curing a monomer or applying a polymer.

Figure 19:
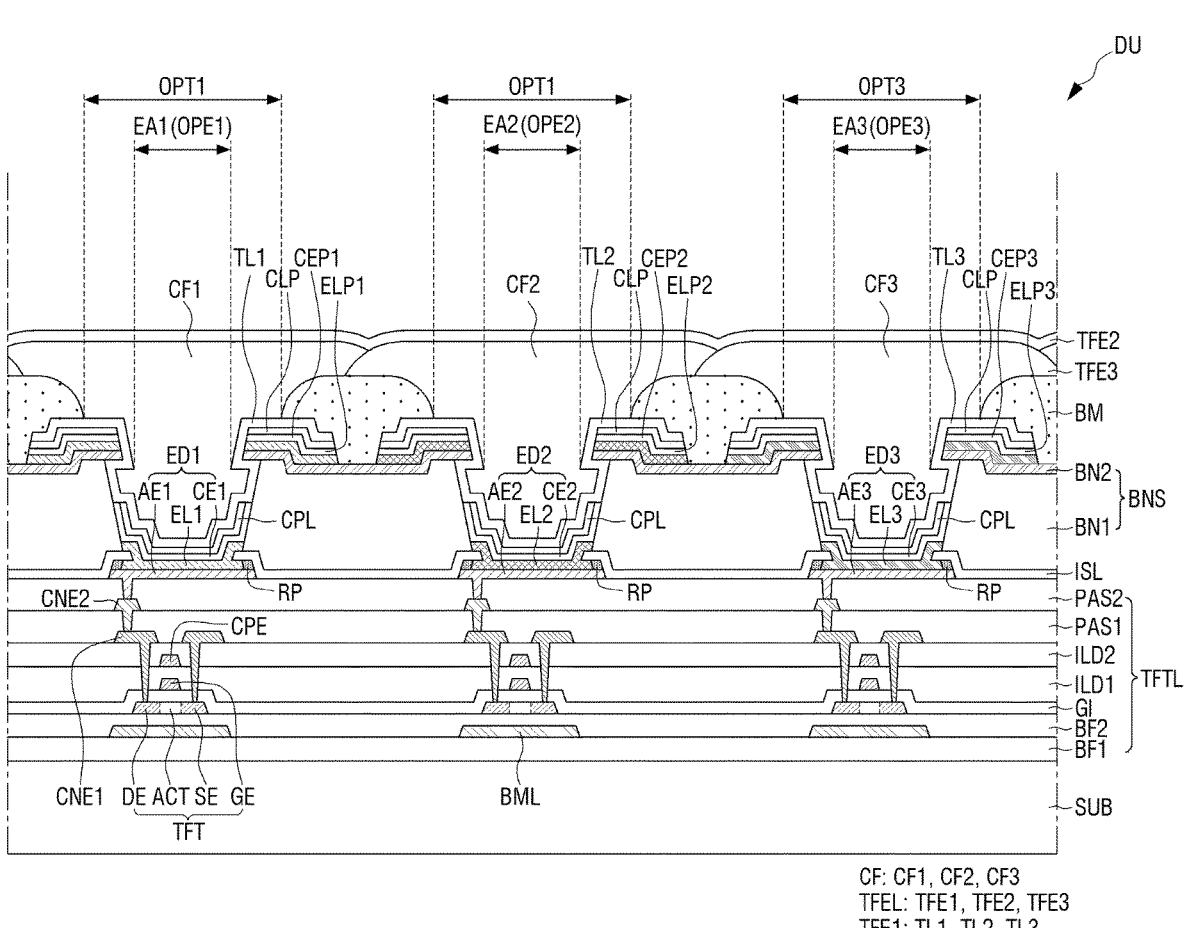
FIG. 19 is a cross-sectional view illustrating a portion of a display device according to an embodiment.
Figure 20:
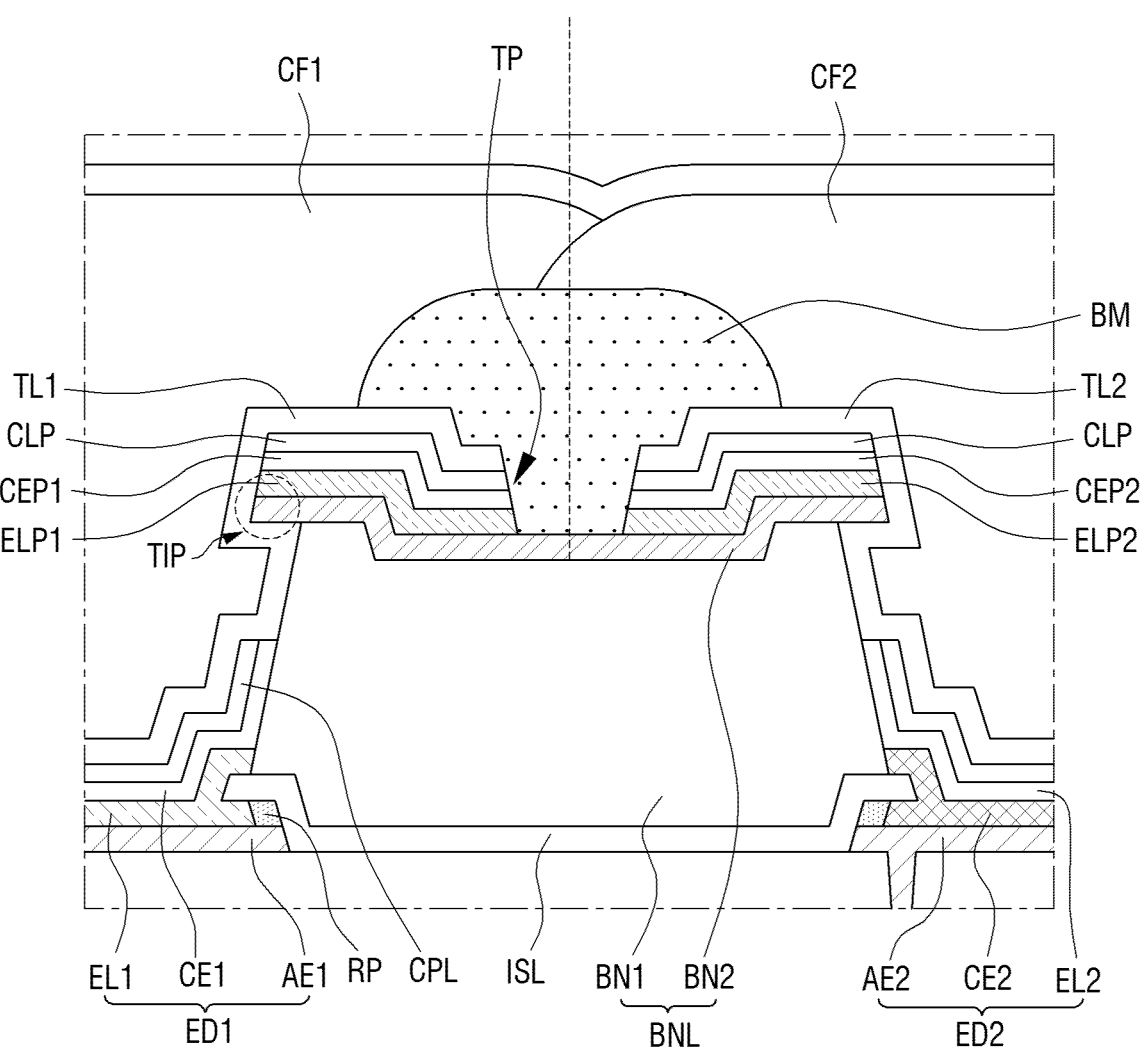
FIG. 20 is an enlarged view illustrating a portion between a first emission area and a second emission area of FIG. 19.

FIG. 19 is a cross-sectional view illustrating a portion of a display device according to an embodiment. FIG. 20 is an enlarged view illustrating a portion between a first emission area and a second emission area of FIG. 19.

Referring to FIGS. 19 and 20, in a display device 10, according to an embodiment, different color filters CF1, CF2, and CF3 may at least partially overlap other color filters CF1, CF2, and CF3 adjacent thereto on the light blocking layer BM. The color filters CF1, CF2, and CF3 disposed on the light blocking layer BM may be disposed so that two color filters CF1, CF2, and CF3 adjacent to each other completely cover the light blocking layer BM. Such overlap between the color filters CF1, CF2, and CF3 may reduce ambient light reflection by the light blocking layer BM, and an overlap layout of the color filters CF1, CF2, and CF3 may be designed so as to further reduce the ambient light reflection.

In the display device 10, the first color filter CF1 and the second color filter CF2 adjacent to each other may at least partially overlap each other on the light blocking layer BM, and the second color filter CF2 and the third color filter CF3 may also at least partially overlap each other on the light blocking layer BM. The first color filter CF1 and the third color filter CF3 adjacent to each other may also at least partially overlap each other on the light blocking layer BM. Each of the color filters CF1, CF2, and CF3 may have a greater area than each of the opening holes OPT1, OPT2, and OPT3 of the light blocking layer BM in a plan view, and some of the color filters CF1, CF2, and CF3 may be disposed directly on the light blocking layer BM.

According to an embodiment, in the display device 10, the first color filter CF1, which is the red color filter, may be disposed at a level above the second color filter CF2, which is the green color filter, and the third color filter CF3, which is the blue color filter. The second color filter CF2, which is the green color filter, may be disposed at a level above the third color filter CF3, which is the blue color filter. Processes for forming the color filters CF1, CF2, and CF3 in manufacturing processes of the display device 10 may be performed in the order of the third color filter CF3, the second color filter CF2, and the first color filter CF1. Each of portions of the first color filter CF1 may be disposed on the second color filter CF2 or the third color filter CF3 at boundaries between the first color filter CF1 and the second color filter CF2 and between the first color filter CF1 and the third color filter CF3. A portion of the second color filter CF2 may be disposed on the third color filter CF3 at a boundary between the second color filter CF2 and the third color filter CF3.

As illustrated in FIG. 20, the color filters CF1, CF2, and CF3 adjacent to each other may at least partially overlap each other on the light blocking layer BM, and the outermost boundary portions of the color filters CF1, CF2, and CF3 may be positioned beyond central portions of the light blocking layer BM. For example, the second color filter CF2 may be disposed on the second light emitting element ED2, and the outermost boundary portion of the second color filter CF2 may be positioned beyond a central portion (dotted line portion of FIG. 20) of the light blocking layer BM toward the first emission area EA1. The first color filter CF1 may be disposed on the first light emitting element ED1, and the outermost boundary portion of the first color filter CF1 may be positioned beyond the central portion (dotted line portion of FIG. 20) of the light blocking layer BM toward the second emission area EA2. The outermost boundary portion of the first color filter CF1 may be disposed on the second color filter CF2, and the outermost boundary portion of the second color filter CF2 may be disposed on the light blocking layer BM.

The light blocking layer BM may include a material absorbing light, but some of the ambient light incident from beyond the display panel may also be reflected by the light blocking layer BM. The color filters CF1, CF2, and CF3 disposed in the opening holes OPT1, OPT2, and OPT3 of the light blocking layer BM may be partially disposed directly on the light blocking layer BM, and may completely cover the light blocking layer BM. The two different color filters CF1, CF2, and CF3 adjacent to each other may include different colorants and may at least partially overlap each other on the light blocking layer BM, and accordingly, ambient light reflection by the light blocking layer BM may be reduced.

The ambient light reflection of the display device 10 may include reflection in the emission areas EA1, EA2, and EA3, reflection in light transmitting areas formed by the opening holes OPT1, OPT2, and OPT3 of the light blocking layer BM, and reflection in the light blocking layer BM. When the sizes of the openings OPE1, OPE2, and OPE3 of the bank structure BNS, the sizes of the opening holes OPT1, OPT2, and OPT3 of the light blocking layer BM, an interval between the openings OPE1, OPE2, and OPE3 and the opening holes OPT1, OPT2, and OPT3, and the like, are adjusted, ambient light reflection in the emission areas EA1, EA2, and EA3 and the light transmitting areas may be controlled. However, when the above conditions are controlled, factors related to light efficiency of the display device 10, such as efficiency and a lifespan of the light emitting elements ED and side visibility of the display device 10 and performance such as touch sensitivity of the touch sensing layer TSU may be affected.

When the color filters CF1, CF2, and CF3 at least partially overlap each other on the light blocking layer BM, the ambient light reflection by the light blocking layer BM may be significantly reduced without affecting the light efficiency of the display device 10 described above. In addition, by adjusting areas and thicknesses of the color filters CF1, CF2, and CF3 in a plan view, widths of overlapping portions between the different color filters CF1, CF2, and CF3, and the like, a color feeling of the reflected light may be controlled to be a color that gives convenience to the user. For example, a color feeling of reflected light in the emission areas EA1, EA2, and EA3 and the light transmitting areas as the reflected light by the ambient light may be controlled according to the areas of the color filters CF1, CF2, and CF3, and reflected light in the light blocking layer BM as the reflected light by the ambient light may change depending on areas, widths, or the like, of portions in which the color filters CF1, CF2, and CF3 at least partially overlap each other.

However, transmissivity of the color filters CF1, CF2, and CF3 may change depending on materials constituting the color filters CF1, CF2, and CF3, and the display device 10 may more effectively reduce the ambient light reflection according to the overlapping order of the color filters CF1, CF2, and CF3. The display device 10 may control the color feeling of the reflected light by the ambient light by adjusting the overlapping order of the color filters CF1, CF2, and CF3.

Figure 21:
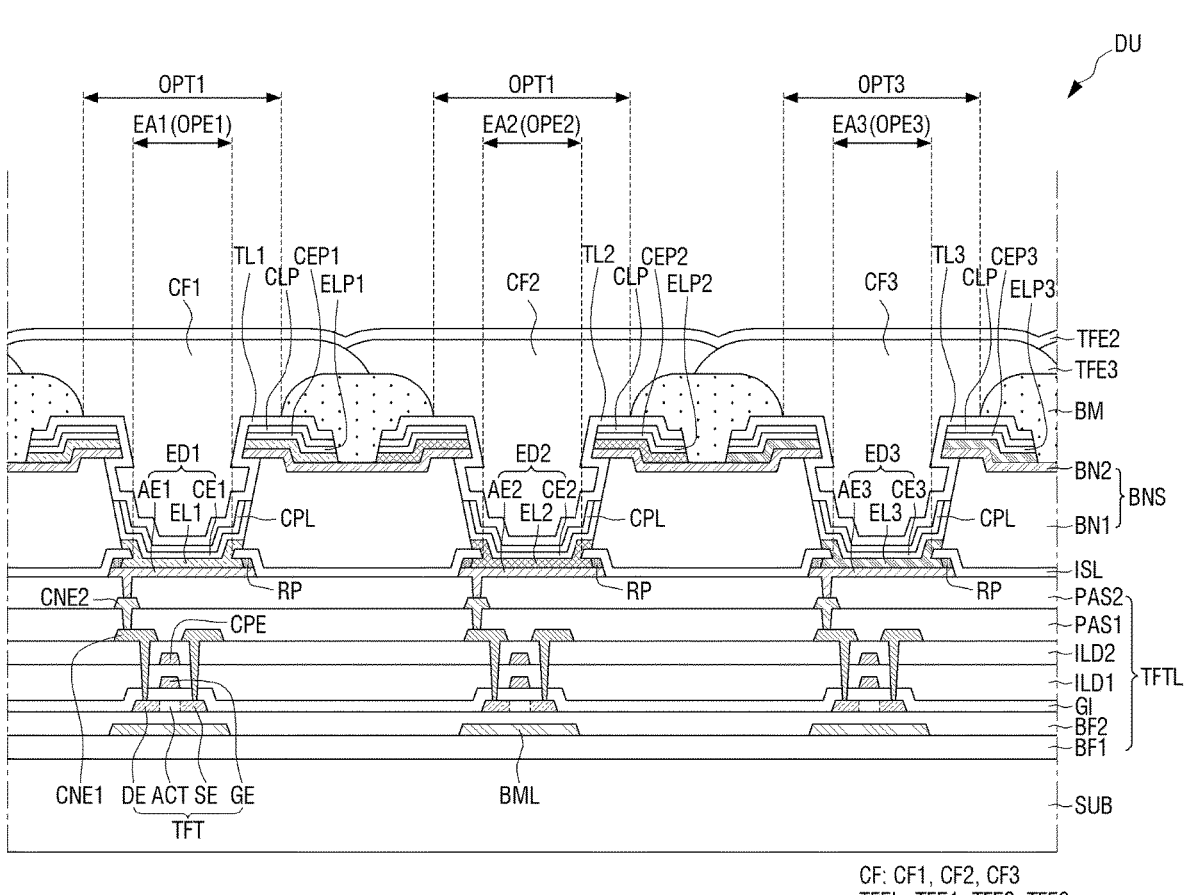
FIG. 21 is a cross-sectional view illustrating a portion of a display device according to an embodiment.
Figure 22:
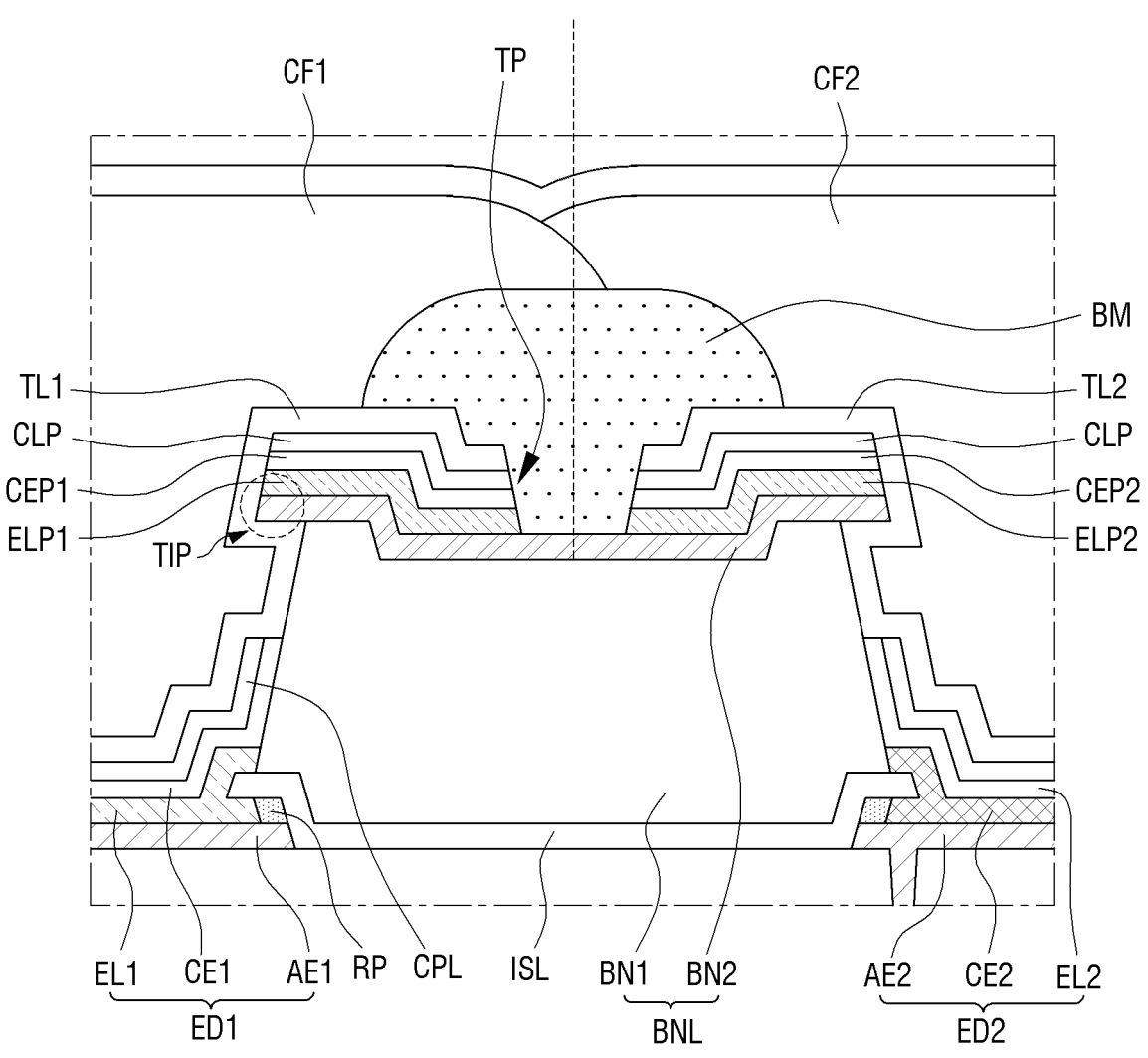
FIG. 22 is an enlarged view illustrating a portion between a first emission area and a second emission area of FIG. 21.

FIG. 21 is a cross-sectional view illustrating a portion of a display device according to an embodiment. FIG. 22 is an enlarged view illustrating a portion between a first emission area and a second emission area of FIG. 21.

Referring to FIGS. 21 and 22, a display device 10 according to an embodiment may be the same as the display device 10 according to an embodiment of FIGS. 19 and 20 in that the color filters CF1, CF2, and CF3 at least partially overlap other color filters CF1, CF2, and CF3 adjacent thereto on the light blocking layer BM, but may be different from the display device 10 according to an embodiment of FIGS. 19 and 20 in the overlapping order of the color filters CF1, CF2, and CF3. For example, in the display device 10, the second color filter CF2, which is the green color filter, may be disposed at a level above the first color filter CF1, which is the red color filter, and the third color filter CF3, which is the blue color filter. The third color filter CF1, which is the red color filter, may be disposed at a level above the first color filter CF3, which is the blue color filter. Processes for forming the color filters CF1, CF2, and CF3 in manufacturing processes of the display device 10 may be performed in the order of the third color filter CF3, the first color filter CF1, and the second color filter CF2. Each of portions of the second color filter CF2 may be disposed on the first filter CF1 or the third color filter CF3 at boundaries between the second color filter CF2 and the first color filter CF1 and between the second color filter CF2 and the third color filter CF3. A portion of the first color filter CF1 may be disposed on the third color filter CF3 at a boundary between the first color filter CF1 and the third color filter CF3.

As illustrated in FIG. 22, the color filters CF1, CF2, and CF3 adjacent to each other may at least partially overlap each other on the light blocking layer BM, and the outermost boundary portions of the color filters CF1, CF2, and CF3 may be positioned beyond central portions of the light blocking layer BM. For example, the second color filter CF2 may be disposed on the second light emitting element ED2, and the outermost boundary portion of the second color filter CF2 may be positioned beyond a central portion (dotted line portion of FIG. 20) of the light blocking layer BM toward the first emission area EA1. The first color filter CF1 may be disposed on the first light emitting element ED1, and the outermost boundary portion of the first color filter CF1 may be positioned beyond the central portion (dotted line portion of FIG. 20) of the light blocking layer BM toward the second emission area EA2. The outermost boundary portion of the first color filter CF1 may be disposed on the light blocking layer BM, and the outermost boundary portion of the second color filter CF2 may be disposed on the first color filter CF1.

In an embodiment, transmissivity of the second color filter CF2, which is the green color filter, may be smaller than transmissivity of the first color filter CF1 and transmissivity of the third color filter CF3 and the second color filter CF2 may be disposed at a level above other color filters (e.g., the first color filter CF1 and the third color filter CF3) on the light blocking layer BM. When the color filters CF1, CF2, and CF3 having a relatively low transmissivity are disposed at a level above other color filters CF1, CF2, and CF3, scattered reflection of light from the light blocking layer BM may be reduced in portions in which the different color filters CF1, CF2, and CF3 at least partially overlap each other. Accordingly, it is possible to prevent light reflected from the light blocking layer BM from being seen by a viewer, and the display device 10 may reduce ambient light reflection occurring in areas other than the emission areas EA1, EA2, and EA3. In concluding the detailed description, those skilled in the art will appreciate that many variations and modifications can be made to the preferred embodiments without substantially departing from the principles of the invention.

What is claimed is:

1. A display device, comprising:
a substrate;
a first pixel electrode and a second pixel electrode disposed on the substrate, the second pixel electrode being spaced apart from the first pixel electrode;
an inorganic insulating layer disposed on the substrate and at least partially overlapping the first pixel electrode and the second pixel electrode;
a bank structure disposed on the inorganic insulating layer and including a first opening at least partially overlapping the first pixel electrode and a second opening at least partially overlapping the second pixel electrode;
a first light emitting layer disposed on the first pixel electrode;
a second light emitting layer disposed on the second pixel electrode;
a first common electrode disposed on the first light emitting layer;
a second common electrode disposed on the second light emitting layer;
a light blocking layer disposed on the bank structure and including a first opening hole at least partially overlapping the first opening and a second opening hole at least partially overlapping the second opening; and
a first color filter disposed in the first opening of the bank structure and the first opening hole of the light blocking layer; and
a second color filter disposed in the second opening of the bank structure and the second opening hole of the light blocking layer,
wherein the bank structure partially overlaps the first opening hole and the second opening hole of the light blocking layer in a cross-sectional view,
wherein the bank structure includes a first bank layer and a second bank layer disposed on the first bank layer, the second bank layer including a metal material that is different from a material of the first bank layer, and
wherein the second bank layer includes tips that protrude farther from sidewalls of the first opening and the second opening than does the first bank layer.

2. The display device of claim 1, wherein the first bank layer includes aluminum (Al), and the second bank layer includes titanium (Ti).

3. The display device of claim 1, wherein the first common electrode and the second common electrode are in direct contact with a first side surface and a second side surface of the first bank layer, respectively.

4. The display device of claim 1, further comprising:
a first organic pattern disposed on the second bank layer and at least partially surrounding the first opening, the first organic pattern including a same material as the first light emitting layer;
a first electrode pattern disposed on the first organic pattern and including a same material as the first common electrode;
a second organic pattern disposed on the second bank layer and at least partially surrounding the second opening, the second organic pattern including a same material as the second light emitting layer; and
a second electrode pattern disposed on the second organic pattern and including a same material as the second common electrode.

5. The display device of claim 4, wherein the light blocking layer is disposed between the first organic pattern and the second organic pattern, and at least portions of the light blocking layer overlap each of the first organic pattern, the second organic pattern, the first electrode pattern, and the second electrode pattern.

6. The display device of claim 5, further comprising:
a first inorganic layer disposed on the first sidewall of the first opening and disposed on the first common electrode and the first electrode pattern; and
a second inorganic layer disposed on the second sidewall of the second opening and disposed on each of the second common electrode and the second electrode pattern,
wherein the first inorganic layer and the second inorganic layer are spaced apart from each other, and
wherein at least portions of the light blocking layer are disposed directly on each of the first inorganic layer and the second inorganic layer.

7. The display device of claim 5, wherein a portion of the first color filter overlaps each of the first organic pattern and the first electrode pattern, and
wherein a portion of the second color filter overlaps each of the second organic pattern and the second electrode pattern.

8. The display device of claim 1, wherein the inorganic insulating layer is not in contact with either upper surfaces of the first pixel electrode or the second pixel electrode,
wherein a portion of the first light emitting layer is disposed between the first pixel electrode and the inorganic insulating layer, and
wherein a portion of the second light emitting layer is disposed between the second pixel electrode and the inorganic insulating layer.

9. The display device of claim 8, further comprising residual patterns disposed between, on one side, the first and second pixel electrodes, and, on another side, the inorganic insulating layer.

10. The display device of claim 1, further comprising:
a third pixel electrode disposed on the substrate and spaced apart from the second pixel electrode;
a third light emitting layer disposed on the third pixel electrode; and
a third common electrode disposed on the third light emitting layer,
wherein the bank structure further includes a third opening at least partially overlapping the third pixel electrode,
wherein the light blocking layer further includes a third opening hole at least partially overlapping the third opening, and wherein the display device further comprises a third color filter disposed in the third opening of the bank structure and the third opening hole of the light blocking layer.

11. The display device of claim 10, further comprising:

a third organic pattern disposed on the second bank layer and at least partially surrounding the third opening, the third organic pattern including a same material as the third light emitting layer;

a third electrode pattern disposed on the third organic pattern and including a same material as the third common electrode; and a third inorganic layer disposed on a sidewall of the third opening and disposed on each of the third common electrode and the third electrode pattern.

12. The display device of claim 1, further comprising an encapsulation layer disposed on each of the light blocking layer and the first and second color filters.

13. An electronic device including a display device, comprising:

a substrate;

a first pixel electrode and a second pixel electrode disposed on the substrate, the second pixel electrode being spaced apart from the first pixel electrode;

an inorganic insulating layer disposed on the substrate and at least partially overlapping the first pixel electrode and the second pixel electrode;

a bank structure disposed on the inorganic insulating layer and including a first opening at least partially overlapping the first pixel electrode and a second opening at least partially overlapping the second pixel electrode;

a first light emitting layer disposed on the first pixel electrode;

a second light emitting layer disposed on the second pixel electrode;

a first common electrode disposed on the first light emitting layer;

a second common electrode disposed on the second light emitting layer;

a light blocking layer disposed on the bank structure and including a first opening hole at least partially overlapping the first opening and a second opening hole at least partially overlapping the second opening; and a first color filter disposed in the first opening of the bank structure and the first opening hole of the light blocking layer; and a second color filter disposed in the second opening of the bank structure and the second opening hole of the light blocking layer, wherein the bank structure includes a first bank layer and a second bank layer disposed on the first bank layer, the second bank layer including a metal material that is different from a material of the first bank layer, and wherein the second bank layer includes tips that protrude farther from sidewalls of the first opening and the second opening than does the first bank layer, wherein the first color filter and the second color filter at least partially overlap each other on the light blocking layer.

14. The electronic device of claim 13, wherein a portion of the first color filter is disposed on the second color filter on the light blocking layer.

15. The electronic device of claim 13, wherein a portion of the second color filter is disposed on the first color filter on the light blocking layer.

16. A display device, comprising:

a bank structure including a plurality of openings arranged in a first direction, a second direction crossing the first direction, and a third direction crossing the first direction and the second direction, wherein light emitting elements emitting light are disposed in the bank structure;

a light blocking layer including a plurality of opening holes at least partially overlapping the plurality of openings and disposed between neighboring pairs of the plurality of openings; and a plurality of color filters disposed in the openings of the bank structure and the opening holes of the light blocking layer and at least partially overlapping the light emitting elements, wherein the bank structure includes a first bank layer and a second bank layer disposed on the first bank layer, the second bank layer including a metal material that is different from a material of the first bank layer, wherein the second bank layer includes tips that protrude from sidewalls of the openings to an extent that is greater than an extent to which the first bank layer protrudes from the sidewalls of the openings, wherein the openings include a first opening, a second opening spaced apart from the first opening in the third direction, and a third opening spaced apart from the second opening in the third direction, wherein the color filters include a first color filter disposed in the first opening, a second color filter disposed in the second opening, and a third color filter disposed in the third opening, and wherein the first color filter, the second color filter, and the third color filter at least partially overlap corresponding other color filters adjacent thereto on the light blocking layer.

17. The display device of claim 16, further comprising a plurality of organic patterns disposed on the bank structure and at least partially surrounding the openings, a plurality of electrode patterns disposed on the organic patterns, and a plurality of inorganic layers disposed on the electrode patterns, wherein the light blocking layer is disposed between neighboring pairs of the organic patterns, the electrode patterns, and the inorganic layers.

18. The display device of claim 17, wherein at least portions of the light blocking layer are disposed directly on the inorganic layers, and wherein at least portions of the first color filter, the second color filter, and the third color filter are disposed directly on the inorganic layers.

19. The display device of claim 16, wherein a portion of the first color filter at least partially covers the second color filter on the light blocking layer.

20. The display device of claim 16, wherein a portion of the second color filter at least partially covers the first color filter on the light blocking layer.

* * * * *